United States Patent
Uchino et al.

(10) Patent No.: US 9,947,575 B2
(45) Date of Patent: Apr. 17, 2018

(54) SEMICONDUCTOR DEVICE AND SEMICONDUCTOR DEVICE FABRICATION METHOD

(71) Applicant: FUJITSU SEMICONDUCTOR LIMITED, Yokohama-shi, Kanagawa (JP)

(72) Inventors: Yasunori Uchino, Kuwana (JP); Kenichi Watanabe, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 15/152,034

(22) Filed: May 11, 2016

(65) Prior Publication Data
US 2016/0254184 A1     Sep. 1, 2016

Related U.S. Application Data

(62) Division of application No. 14/293,435, filed on Jun. 2, 2014, now Pat. No. 9,368,430.

(30) Foreign Application Priority Data

Jun. 17, 2013   (JP) ................................ 2013-126269

(51) Int. Cl.
*H01L 21/44*     (2006.01)
*H01L 21/768*    (2006.01)
(Continued)

(52) U.S. Cl.
CPC .... *H01L 21/76816* (2013.01); *G06F 17/5077* (2013.01); *H01L 21/76802* (2013.01);
(Continued)

(58) Field of Classification Search
CPC ......... H01L 21/76802; H01L 21/76816; H01L 21/76877
(Continued)

(56) References Cited

U.S. PATENT DOCUMENTS 5,712,509 A   1/1998  Harada et al.
6,130,481 A   10/2000 Harada et al.
(Continued)

FOREIGN PATENT DOCUMENTS

JP     04-332152 A     11/1992
JP     2001-035851 A   2/2001
(Continued)

OTHER PUBLICATIONS

Office Action dated Feb. 7, 2017, issued in counterpart Japanese Application No. 2013-126269, with English translation (7 pages).

*Primary Examiner* — Nitin Parekh
(74) *Attorney, Agent, or Firm* — Westerman, Hattori, Daniels & Adrian, LLP

(57) ABSTRACT

A multilayer wiring in a semiconductor device includes a first lower wiring formed in a first insulating layer, a via which is formed in a second insulating layer over the first insulating layer and which is connected to the first lower wiring, and an upper wiring connected to the via. The upper wiring has an outer edge at which a nick portion is formed beside a portion of the upper wiring to which the via is connected. The formation of the nick portion at the outer edge of the upper wiring prevents the via from enlarging.

1 Claim, 26 Drawing Sheets

(51) Int. Cl.
*H01L 23/48* (2006.01)
*G06F 17/50* (2006.01)
*H01L 23/522* (2006.01)
*H01L 23/528* (2006.01)

(52) U.S. Cl.
CPC .. *H01L 21/76807* (2013.01); *H01L 21/76808* (2013.01); *H01L 21/76877* (2013.01); *H01L 23/481* (2013.01); *H01L 23/528* (2013.01); *H01L 23/5226* (2013.01); *H01L 2924/0002* (2013.01)

(58) Field of Classification Search
USPC ........................................................ 438/622
See application file for complete search history.

(56) References Cited

U.S. PATENT DOCUMENTS

| | | | |
|---|---|---|---|
| 6,313,026 B1 | 11/2001 | Huang et al. | |
| 6,433,287 B1 | 8/2002 | Sasaki et al. | |
| 6,621,167 B1 | 9/2003 | Lin et al. | |
| 7,893,536 B2 | 2/2011 | Takada et al. | |
| 7,939,942 B2 | 5/2011 | Park et al. | |
| 8,426,978 B2 | 4/2013 | Ichiryu et al. | |
| 8,674,470 B1* | 3/2014 | Or-Bach | H01L 24/25 257/499 |
| 2001/0030367 A1* | 10/2001 | Noguchi | H01L 21/02063 257/758 |
| 2002/0182855 A1* | 12/2002 | Agarwala | H01L 21/76852 438/638 |
| 2004/0207087 A1* | 10/2004 | Kurashina | G02F 1/136227 257/758 |
| 2004/0210862 A1 | 10/2004 | Igarashi et al. | |
| 2006/0022341 A1* | 2/2006 | Sir | H01L 21/486 257/758 |
| 2006/0071339 A1 | 4/2006 | Matsubara et al. | |
| 2006/0180930 A1 | 8/2006 | Nguyen et al. | |
| 2009/0039520 A1 | 2/2009 | Tanaka et al. | |
| 2009/0045521 A1 | 2/2009 | Abe | |

FOREIGN PATENT DOCUMENTS

| | | |
|---|---|---|
| JP | 2001-298081 A | 10/2001 |
| JP | 2005-209979 A | 8/2005 |
| JP | 2008-047582 A | 2/2008 |
| JP | 2008-305814 A | 12/2008 |
| JP | 2009-049034 A | 3/2009 |

* cited by examiner

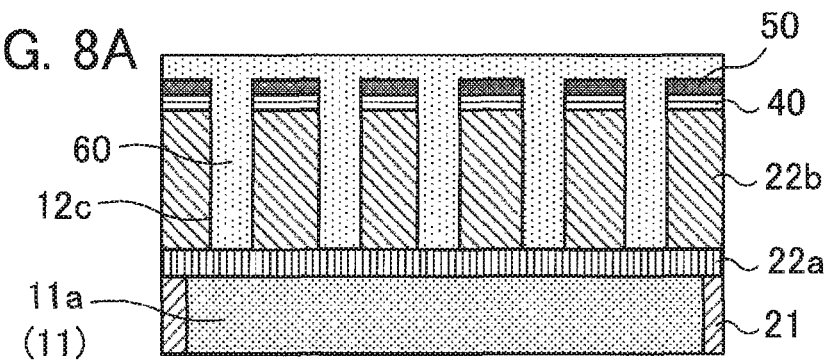
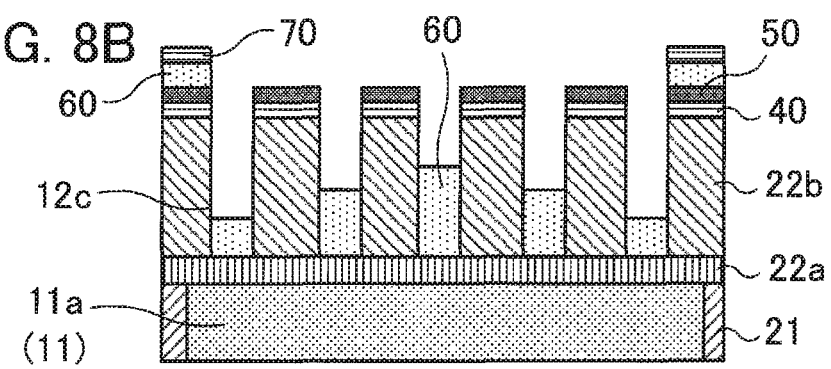
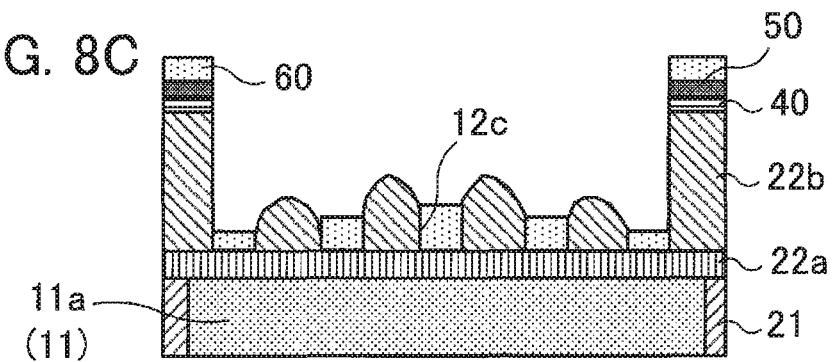
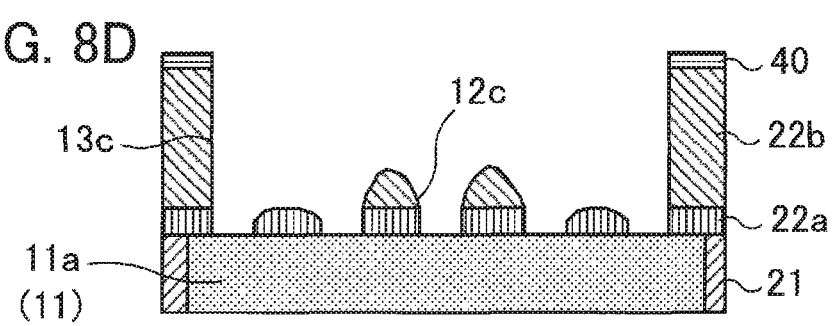

FIG. 16A
FIG. 16B
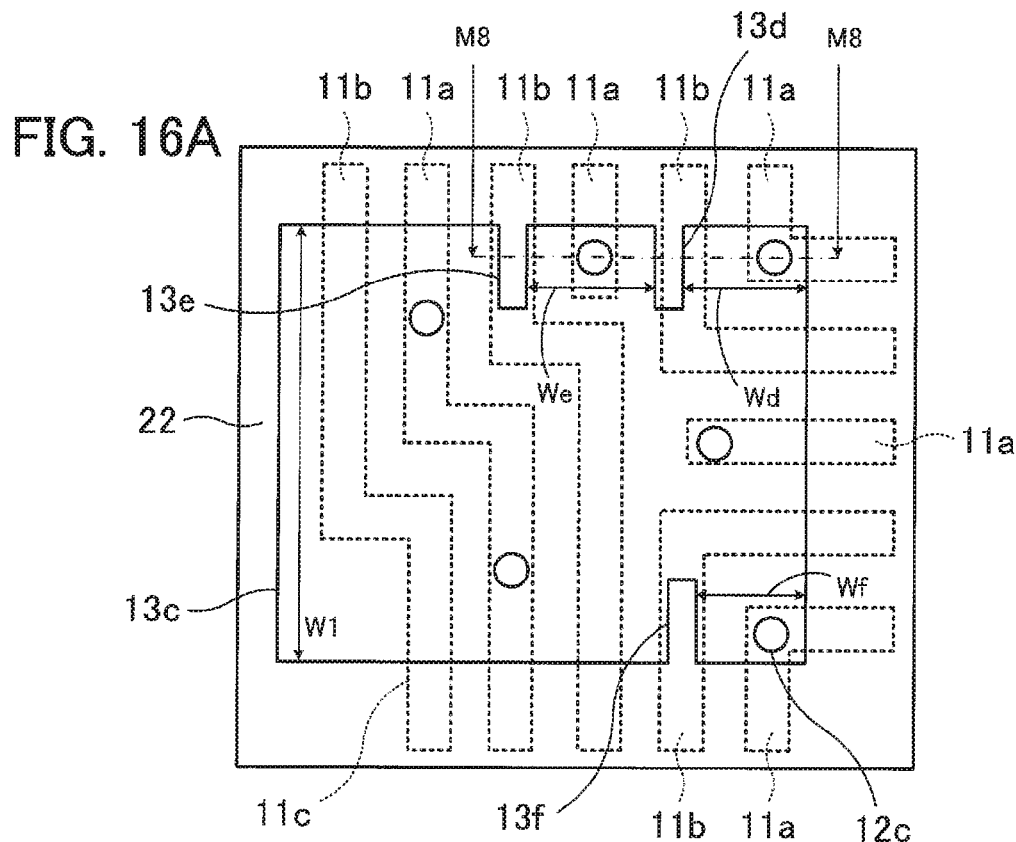
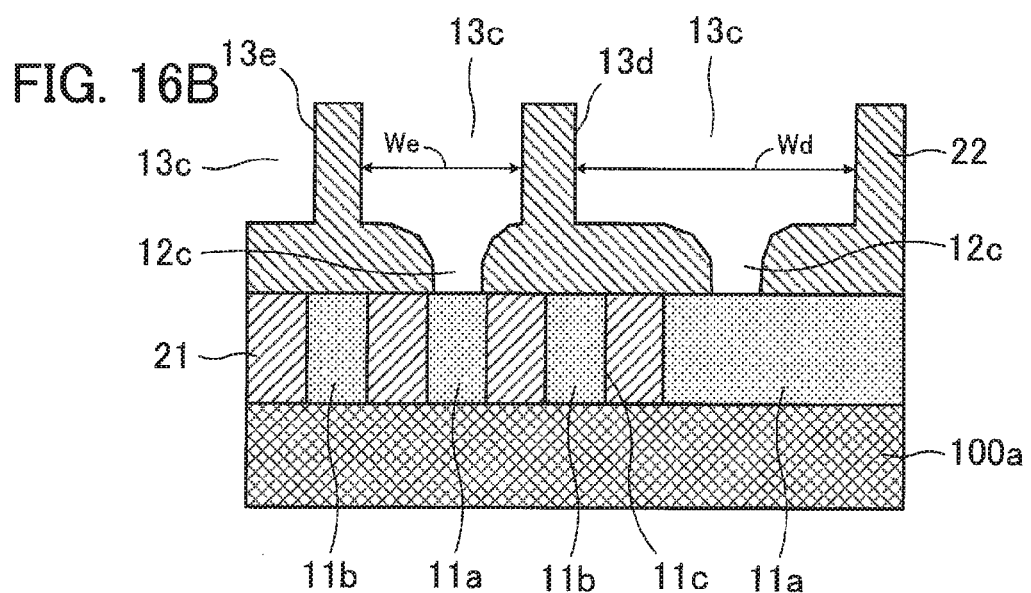

SEMICONDUCTOR DEVICE AND SEMICONDUCTOR DEVICE FABRICATION METHOD

CROSS-REFERENCE TO RELATED APPLICATION

This application is a divisional of application Ser. No. 14/293,435, filed on Jun. 2, 2014, which is based upon and claims the benefit of priority of the prior Japanese Patent Application No. 2013-126269, filed on Jun. 17, 2013, the entire contents of which are incorporated herein by reference.

FIELD

The embodiment discussed herein is related to a semiconductor device and a semiconductor device fabrication method.

BACKGROUND

With semiconductor devices a multilayer wiring including a structure in which a lower wiring and an upper wiring are connected by a via is known.

The following dual damascene methods are known as techniques for forming a via and an upper wiring in the multilayer wiring. With the dual damascene methods, a hole for a via (via hole) which communicates with a lower wiring and an upper wiring trench are formed in an insulating layer, such as an interlayer insulating film, and a conductive material is embedded in the via hole and the trench.

Furthermore, the following method (via first dual damascene method) is known as one of the dual damascene methods. With the via first dual damascene method, a via hole which communicates with a lower wiring is formed first by etching, then a trench which communicates with the via hole is formed by etching, and then a conductive material is embedded in the via hole and the trench.

Japanese Laid-open Patent Publication No. 04-332152
Japanese Laid-open Patent Publication No. 2009-049034
Japanese Laid-open Patent Publication No. 2008-047582

If the dual damascene method in which a via hole that communicates with a lower wiring is formed first and in which after that a trench that communicates with the via hole is formed is adopted, the size of the via hole formed first may become larger than a desired size as a result of etching performed at the time of forming the trench.

SUMMARY

According to an aspect, there is provided a semiconductor device that includes: a first insulating layer; a first wiring formed in the first insulating layer; a second insulating layer formed over the first insulating layer; a via formed in the second insulating layer and connected to the first wiring; a second wiring formed in the second insulating layer, and connected to the via at a portion of the second wiring; and a first nick portion located at an outer edge of the second wiring beside the portion of the second wiring.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 8A through 8D illustrate an example of a multilayer wiring formation process;
FIGS. 16A and 16B illustrate an example of a trench formation process.

DESCRIPTION OF EMBODIMENTS

Enlargement of a via which connects a lower wiring and an upper wiring will be described first.

Figure 1:
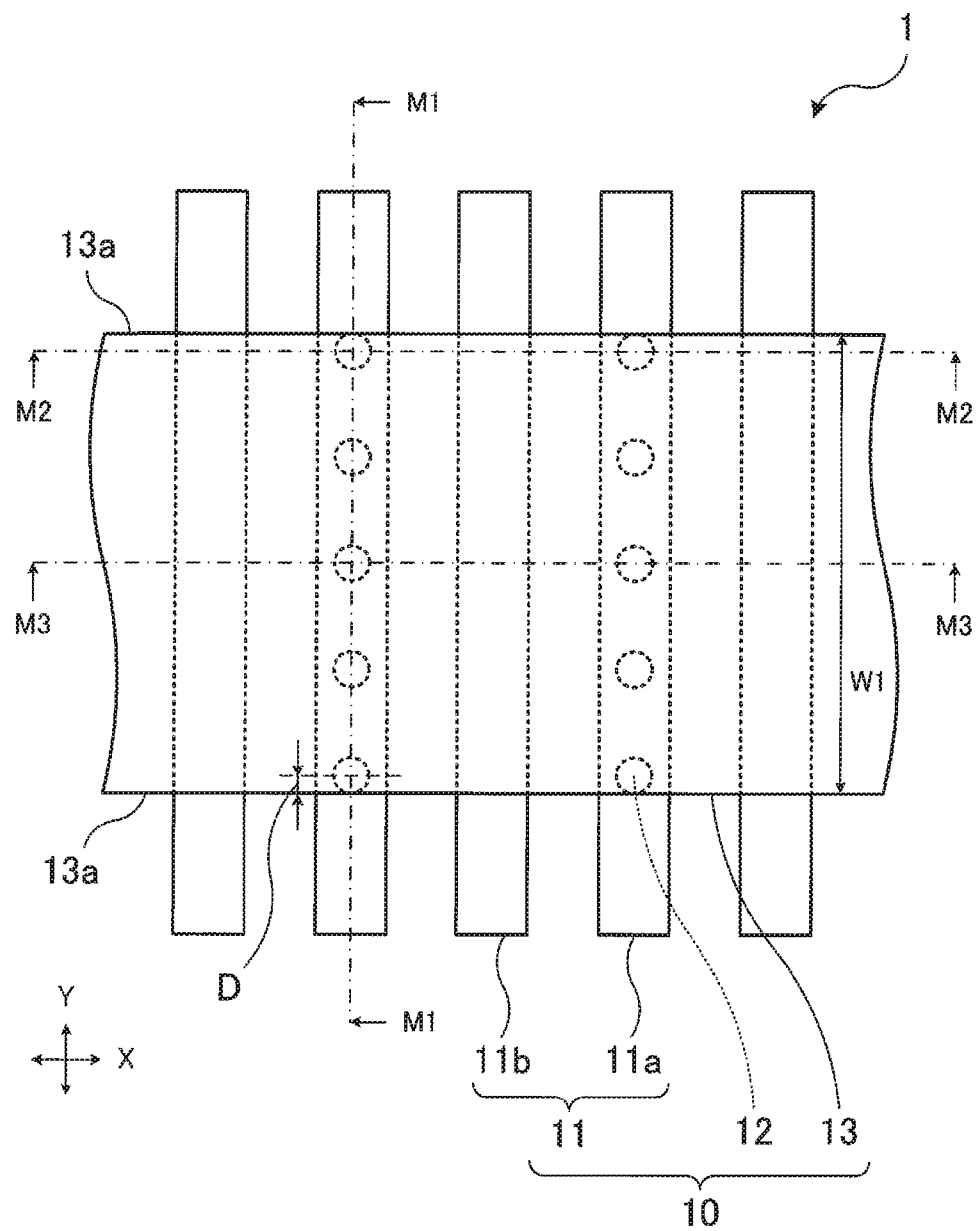
FIG. 1 schematically illustrates an example of a layout of a conductive portion in a multilayer wiring.

FIG. 1 schematically illustrates an example of a layout of a conductive portion in a multilayer wiring.

A multilayer wiring 1 illustrated in FIG. 1 includes a plurality of lower wirings 11, a plurality of vias 12, and an upper wiring 13 as a conductive portion 10.

Each of the plurality of (five, in this example) lower wirings 11 extends in a Y direction and the plurality of lower wirings 11 are formed in parallel in an X direction. The lower wirings 11 include, for example, a lower wiring (first lower wiring) 11a set to first potential and a lower wiring (second lower wiring) 11b set to second potential different from the first potential. In FIG. 1, the first lower wirings 11a and the second lower wirings 11b are alternately formed in parallel.

The plurality of (five, in this example) vias 12 are formed in parallel in the Y direction over each of the first lower wirings 11a of the first lower wirings 11a and the second lower wirings 11b. Each via 12 illustrated in FIG. 1 has a round shape from above. However, the shape from above of each via 12 is not limited to a round shape. Each via 12 may have an approximately round shape, an elliptical shape, an approximately elliptical shape, a rectangular shape, an approximately rectangular shape, or the like. The upper wiring 13 having a width of W1 is wide compared with the lower wirings 11. The upper wiring 13 extends in the X direction and is connected to the plurality of vias 12 formed over each first lower wiring 11a.

The conductive portion 10 including the above lower wirings 11 (including the first lower wirings 11a and the second lower wirings 11b), vias 12, and upper wiring 13 is formed in an insulating portion of the multilayer wiring 1.

Figure 2:
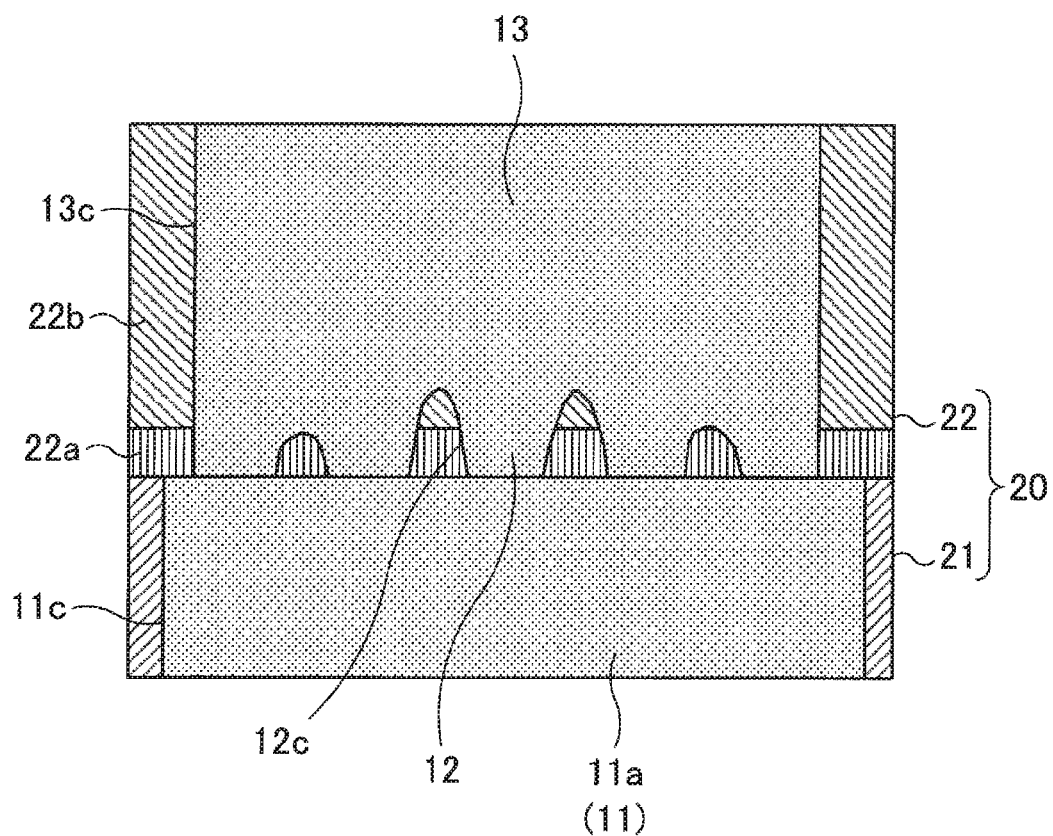
FIG. 2 schematically illustrates an example of a section of the multilayer wiring taken along line M1-M1 of FIG. 1.
Figure 3:
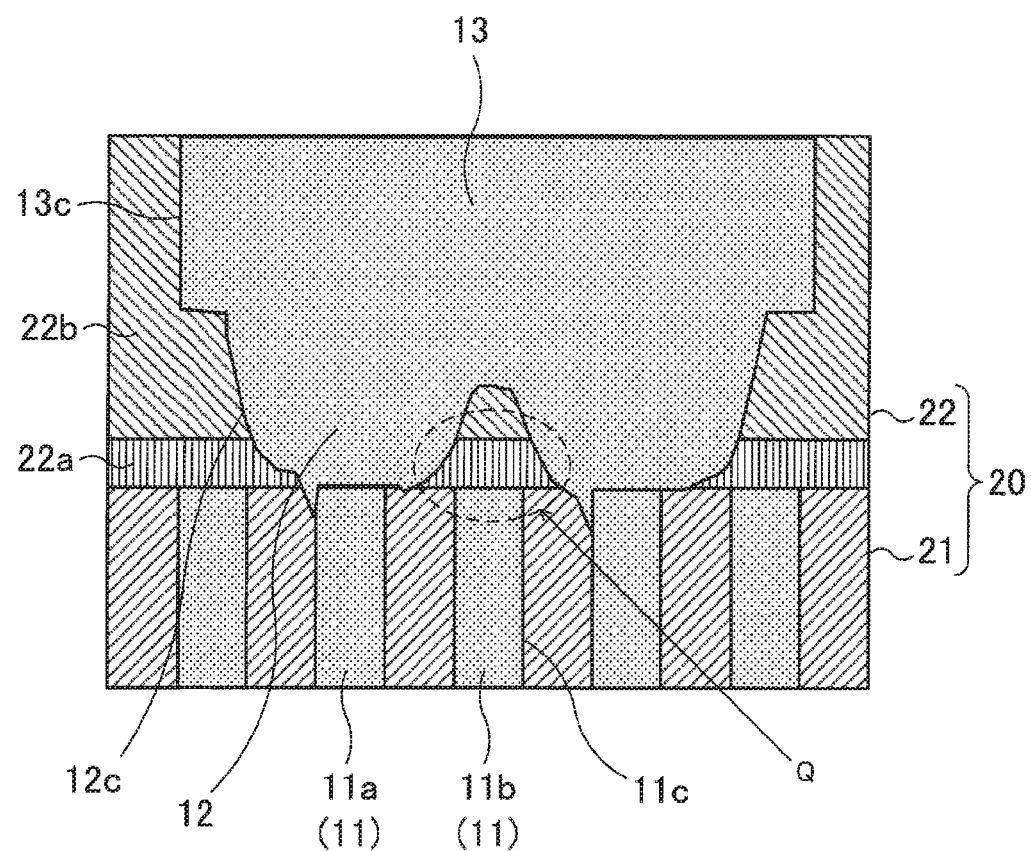
FIG. 3 schematically illustrates an example of a section of the multilayer wiring taken along line M2-M2 of FIG. 1.
Figure 4:
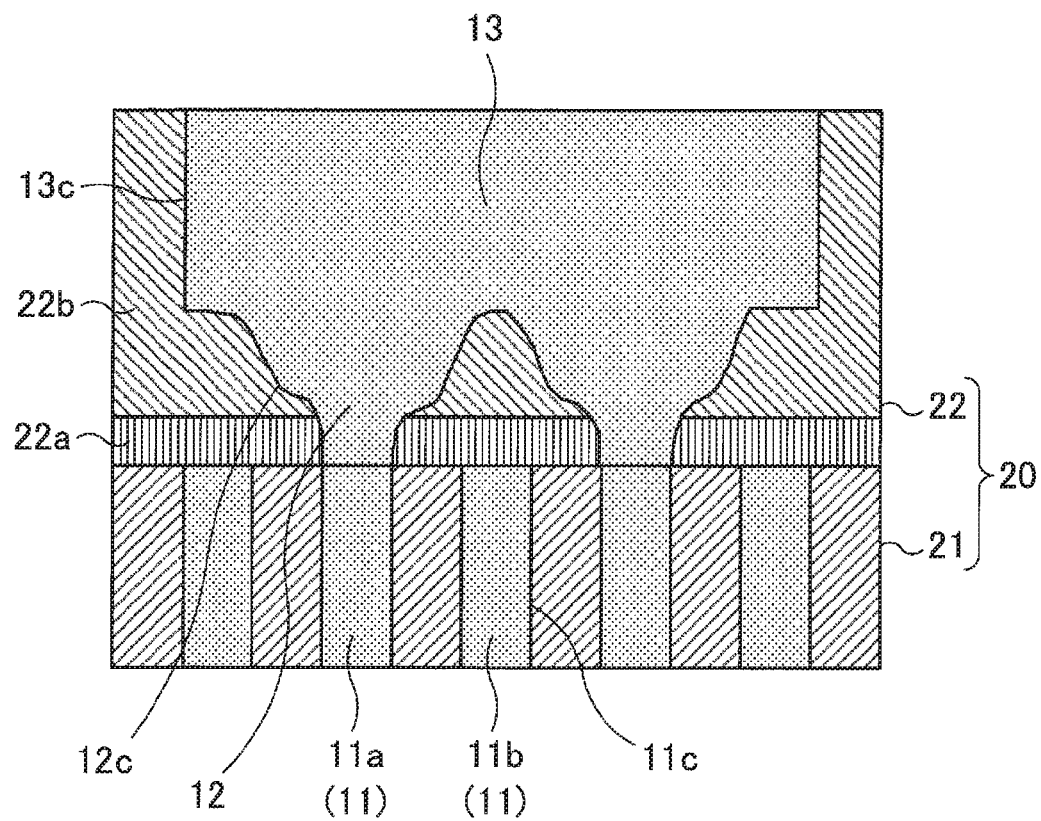
FIG. 4 schematically illustrates an example of a section of the multilayer wiring taken along line M3-M3 of FIG. 1.

FIG. 2 schematically illustrates an example of a section of the multilayer wiring taken along line M1-M1 of FIG. 1 (in the direction in which the lower wiring extends). FIG. 3 schematically illustrates an example of a section of the multilayer wiring taken along line M2-M2 of FIG. 1 (along an end portion of the upper wiring). FIG. 4 schematically illustrates an example of a section of the multilayer wiring taken along line M3-M3 of FIG. 1 (along a central portion of the upper wiring).

As illustrated in FIGS. 2 through 4, the first lower wirings 11a and the second lower wirings 11b, the vias 12, and the upper wiring 13 included in the conductive portion 10 of the multilayer wiring 1 are formed in an insulating portion 20. In this example, the first lower wirings 11a and the second lower wirings 11b are formed in an insulating layer 21 and the vias 12 and the upper wiring 13 are formed in an insulating layer 22 (including a cover film 22a and an interlayer insulating film 22b).

The multilayer wiring 1 including the first lower wirings 11a and the second lower wirings 11b, the vias 12, and the upper wiring 13 formed in the insulating portion 20 is formed by damascene methods.

In this case, the first lower wirings 11a and the second lower wirings 11b are formed by, for example, a single damascene method. With the single damascene method, trenches 11c for forming the first lower wirings 11a and the second lower wirings 11b are formed first in the insulating layer 21 by etching, then a determined conductive material is embedded in the trenches 11c.

The vias 12 and the upper wiring 13 are formed by, for example, what is called a via first dual damascene method, which is one of the dual damascene methods. With the via first dual damascene method, the cover film 22a and the interlayer insulating film 22b are formed in order as an upper insulating layer 22 over the insulating layer 21 in which the first lower wirings 11a and the second lower wirings 11b are formed. After that via holes 12c which communicate with the first lower wirings 11a are formed first by etching, then a trench 13c which communicates with the via holes 12c is formed by etching. A determined conductive material is embedded in the via holes 12c and the trench 13c.

The insulating layer 21 is formed by the use of, for example, silicon oxide carbide (SiOC). The cover film 22a is formed by the use of, for example, silicon carbide (SiC).

The interlayer insulating film 22b is formed by the use of, for example, SiOC. The first lower wirings 11a and the second lower wirings 11b, the vias 12, and the upper wiring 13 are formed by the use of, for example, copper (Cu) or a conductive material which contains Cu.

In the examples of FIGS. 2 through 4, the vias at the end portions and the central portion of the upper wiring 13 differ in shape. This will be described later in detail.

In addition, barrier metal films (not illustrated in FIG. 2, 3, or 4) may be formed on inner walls of the above trenches 11c, via holes 12c, and trench 13c by the use of tantalum (Ta), titanium (Ti), tantalum nitride, titanium nitride, or the like.

Figure 5:
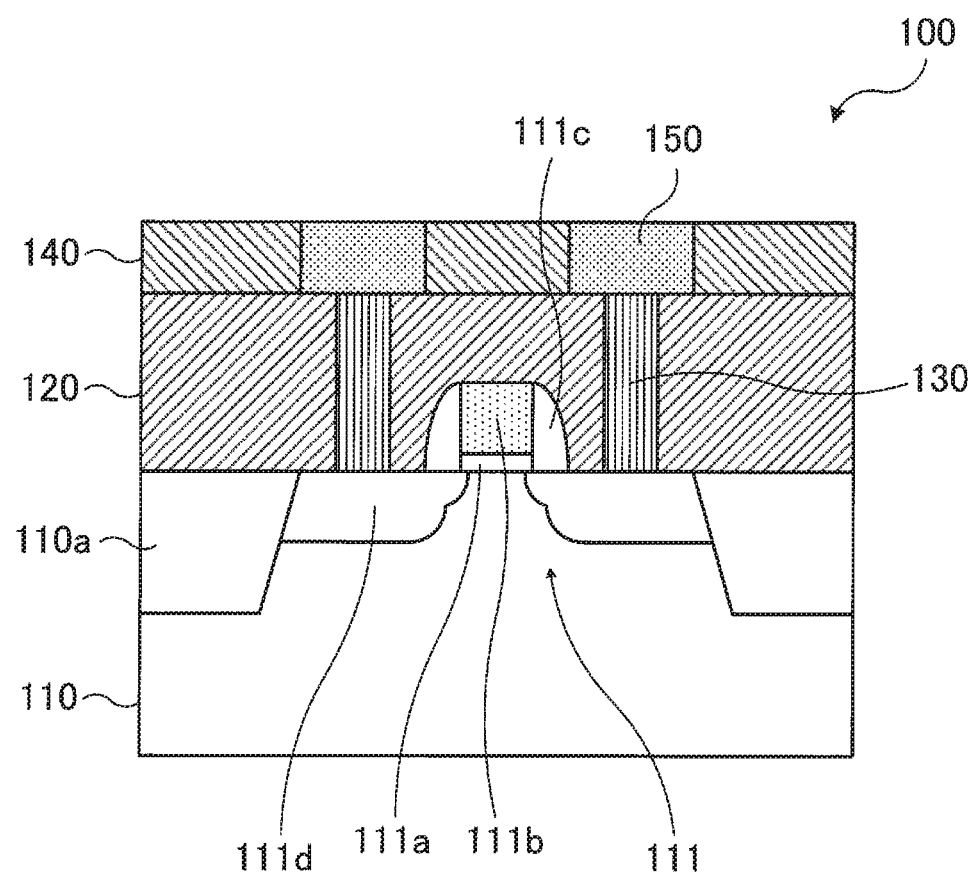
FIG. 5 is a fragmentary schematic sectional view of an example of a substrate over which the multilayer wiring is formed.

The multilayer wiring 1 including the above conductive portion 10 and insulating portion 20 is formed over, for example, a substrate illustrated in FIG. 5.

FIG. 5 is a fragmentary schematic sectional view of an example of a substrate over which the multilayer wiring is formed.

A substrate 100 illustrated in FIG. 5 includes a semiconductor substrate 110, an insulating layer 120, and plugs 130.

For example, a silicon (Si) substrate is used as the semiconductor substrate 110. A compound semiconductor substrate, such as a gallium arsenide (GaAs) substrate or an indium phosphide (InP) substrate, may be used as the semiconductor substrate 110.

A semiconductor element 111, such as a transistor, is formed in an element region of the semiconductor substrate 110 demarcated by isolation regions 110a. In the example of FIG. 5, a MOS (Metal Oxide Semiconductor) field effect transistor is illustrated as the semiconductor element 111. In the example of FIG. 5, one semiconductor element 111 is illustrated. However, a plurality of semiconductor elements 111 may be formed in the semiconductor substrate 110.

The semiconductor element 111 illustrated in FIG. 5 includes a gate insulating film 111a formed over the semiconductor substrate 110, a gate electrode 111b formed over the gate insulating film 111a, and an insulating spacer 111c formed on side walls of the gate electrode 111b. Impurity regions 111d which function as a source and a drain of the semiconductor element 111 are formed on both sides of the gate electrode 111b in the semiconductor substrate 110.

The insulating layer 120 which includes one or more layers and which covers the above semiconductor element 111 is formed over the semiconductor substrate 110 in which the semiconductor element 111 is formed. The plugs 130 which pierce the insulating layer 120 and which are connected to the gate electrode 111b and the impurity regions 111d of the semiconductor element 111 are formed in the insulating layer 120. FIG. 5 illustrates only plugs 130 connected to the impurity regions 111d.

As illustrated in FIG. 5, wirings 150 are formed in an insulating layer 140 over the plugs 130. For example, the wirings 150 in the insulating layer 140 illustrated in FIG. 5 correspond to the first lower wiring 11a and the second lower wiring 11b in the insulating layer 21 of the above multilayer wiring 1. Alternatively, wirings which are formed in a layer over the wirings 150 illustrated in FIG. 5 and which are electrically connected to the wirings 150 correspond to the first lower wiring 11a and the second lower wiring 11b of the above multilayer wiring 1.

The above multilayer wiring 1 is formed over the substrate 100 having the above structure, and a semiconductor device is formed.

As stated above, the multilayer wiring 1 can be formed by the damascene methods. If the vias 12 over the first lower wirings 11a and the upper wiring 13 are formed by the via first dual damascene method, the size of the via holes 12c for forming the vias 12 may become larger than a desired size based on design. For example, such enlargement of the via holes 12c occurs because the via holes 12c previously formed are exposed to an etching environment at the time of forming the trench 13c by etching for forming the upper wiring 13. The via holes 12c enlarge, so the vias 12 formed therein become larger than the desired size.

The tendency of the vias 12 (via holes 12c for forming the vias 12) to enlarge and the degree of the enlargement may change according to the width W1 of the upper wiring 13, the positions of the vias 12 relative to the upper wiring 13, or the like.

Figure 6:
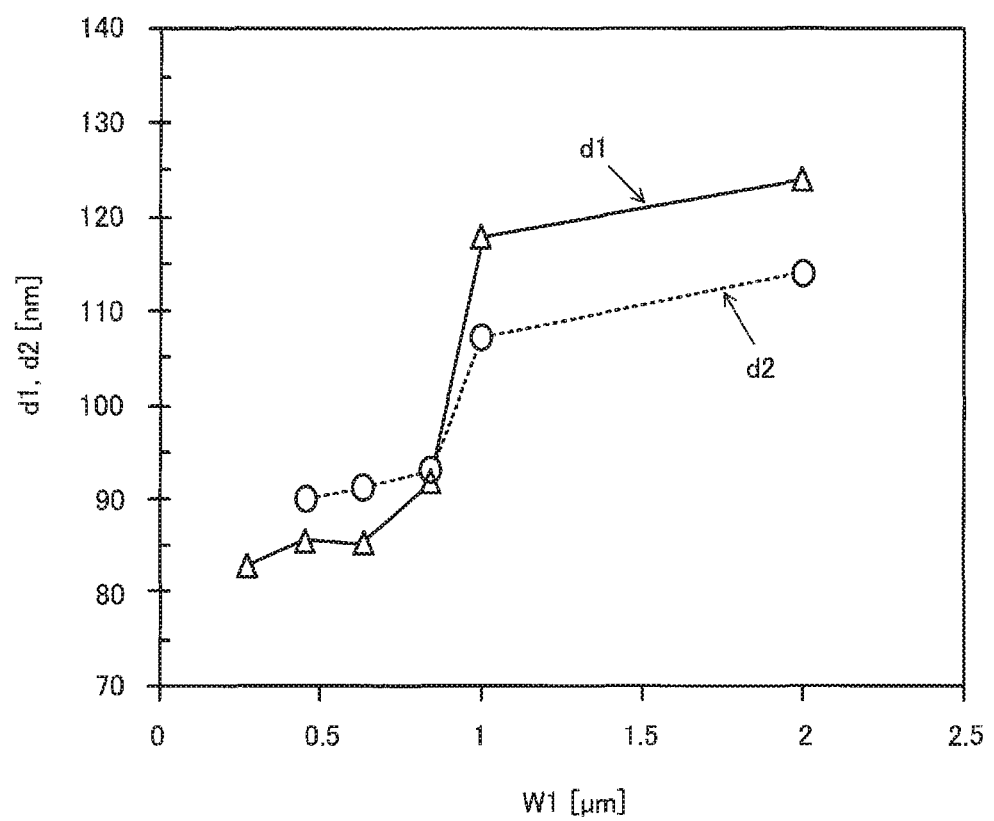
FIG. 6 indicates an example of the relationship between the width of an upper wiring and the diameter of vias.

FIG. 6 indicates an example of the relationship between the width of the upper wiring and the diameter of the vias.

FIG. 6 indicates an example of the relationship between the width W1 of the upper wiring 13 and a diameter (d1) of the vias 12 at the end portions of the upper wiring 13 and a diameter (d2) of the vias 12 at the central portion of the upper wiring 13 in the above multilayer wiring 1 the layout of which is illustrated in FIG. 1. In this case, distance D between the vias 12 at the end portions of the upper wiring 13 and edges 13a of the upper wiring 13 is 0.1 μm or less.

As indicated in FIG. 6, if the width W1 of the upper wiring 13 exceeds 1 μm, the vias 12 at the end portions and the central portion of the upper wiring 13 tend to enlarge. Furthermore, if the width W1 of the upper wiring 13 exceeds 1 μm, the degree of the enlargement of the vias 12 at the end portions of the upper wiring 13 tends to become higher than that of the enlargement of the vias 12 at the central portion of the upper wiring 13.

In the examples of FIGS. 2 through 4, the vias 12 at the end portions of the upper wiring 13 enlarge more than the vias 12 at the central portion of the upper wiring 13. As illustrated in FIGS. 2 and 4, the vias 12 at the central portion of the upper wiring 13 enlarge in a comparatively small degree and are connected to the first lower wirings 11a. As illustrated in FIGS. 2 and 3, on the other hand, the vias 12 at the end portions of the upper wiring 13 enlarge in a comparatively large degree and are connected to the first lower wirings 11a.

Figure 7A:
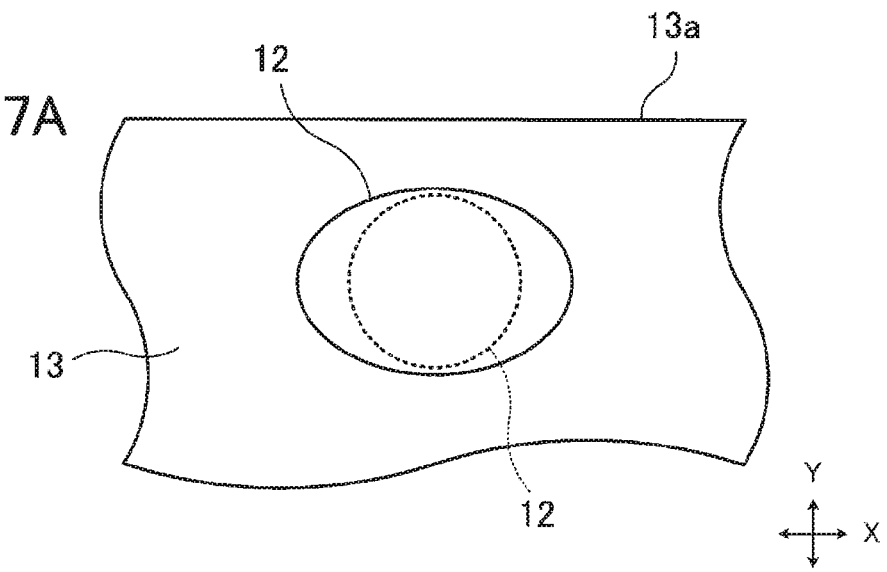
FIGS. 7A and 7B are schematic plan views of an example of a via which has enlarged.
Figure 7B:
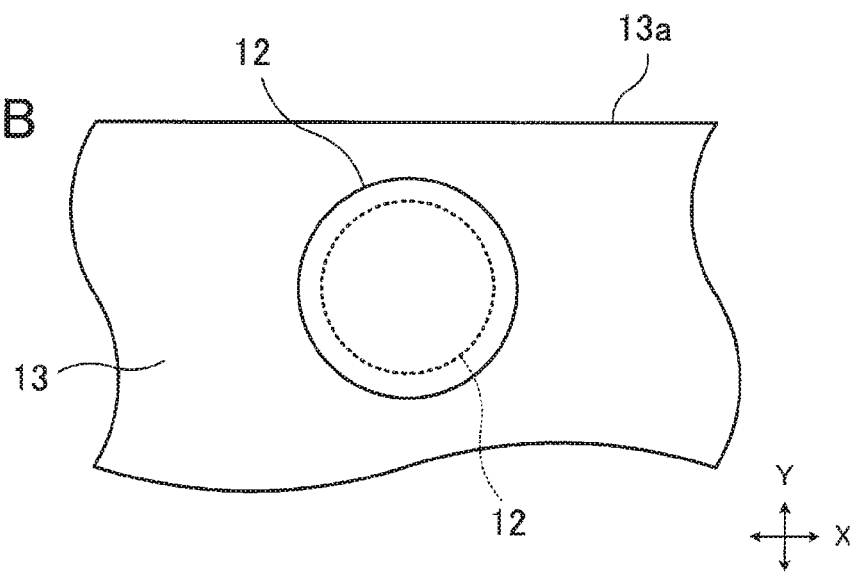

FIGS. 7A and 7B are schematic plan views of an example of a via which has enlarged.

For convenience of explanation, a via 12 which has not enlarged is indicated by a dotted line and a via 12 which has enlarged is indicated by a solid line.

As indicated in FIG. 7A, for example, a via 12 may enlarge in a direction (X direction) in which the edges 13a of the upper wiring 13 extend. In addition, as indicated in FIG. 7B, a via 12 may enlarge so as to extend outward as a whole. The vias 12 at the end portions of the upper wiring 13 tend to enlarge in a manner indicated in FIG. 7A, that is to say, to enlarge in the direction in which the edges 13a of the upper wiring 13 extend. The vias 12 at the central portion of the upper wiring 13 tend to enlarge in a manner indicated in FIG. 7B, that is to say, to enlarge so as to extend outward as a whole.

As illustrated in FIGS. 2 through 4, when a comparatively wide upper wiring 13 whose width W1 is larger than 1 μm is formed, vias 12 at end portions of the upper wiring 13 to be formed enlarge significantly, compared with vias 12 at a central portion of the upper wiring 13 to be formed. This structure will be obtained through the following mechanism.

FIGS. 8A through 8D illustrate an example of a multilayer wiring formation process.

An example of a process for forming the multilayer wiring 1 will now be described with the section (taken along line M1-M1 of FIG. 1) illustrated in FIG. 2 as an example.

A step illustrated in FIG. 8A is as follows. First the cover film 22a and the interlayer insulating film 22b are formed in order as the insulating layer 22 over the insulating layer 21 in which the lower wirings 11 (only the first lower wiring 11a is illustrated) are formed. After that, a mask film 40 and an anti-reflection coating 50 are formed. Next, patterning is performed on the anti-reflection coating 50 and the mask film 40 over the interlayer insulating film 22b by the use of photolithography to form openings in regions in the anti-reflection coating 50 and the mask film 40 in which the vias 12 are to be formed. The interlayer insulating film 22b is etched with the anti-reflection coating 50 and the mask film 40 on which patterning has been performed in this way as a mask to form the via holes 12c. After the via holes 12c are formed, photoresist 60 is embedded in the via holes 12c.

A step illustrated in FIG. 8B is as follows. First a mask film 70 is formed over the photoresist 60 illustrated in FIG. 8A. Patterning is performed on the mask film 70 over the photoresist 60 by the use of the photolithography to form an opening in a region in the mask film 70 in which a comparatively wide upper wiring 13 is to be formed. The photoresist 60 is etched with the mask film 70 on which patterning has been performed in this way as a mask to expose portions of the interlayer insulating film 22b between which a trench for the upper wiring 13 is to be formed.

Figure 9:
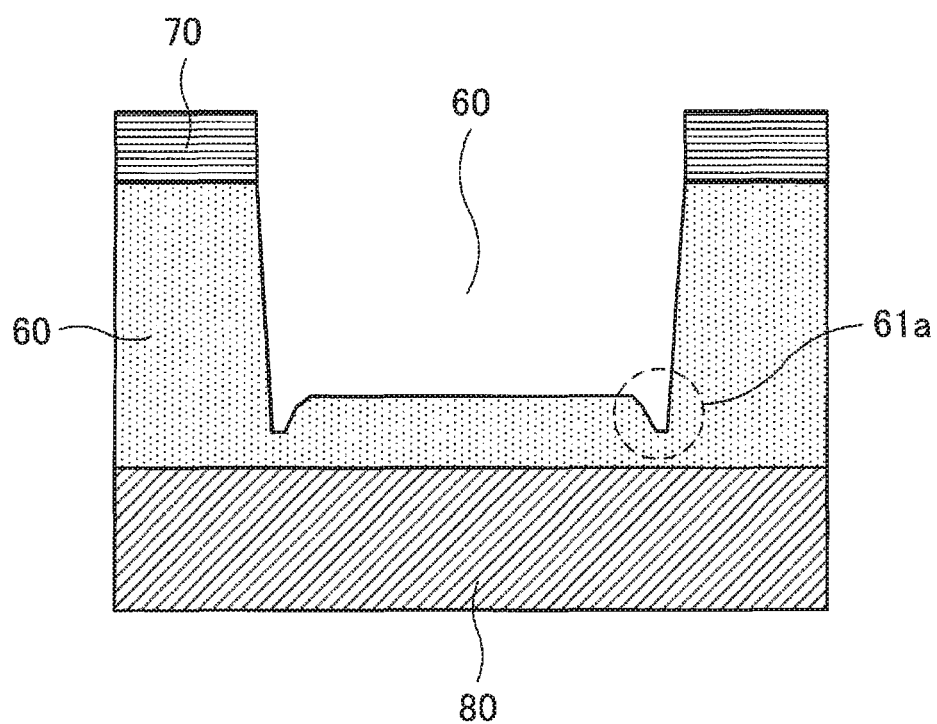
FIG. 9 schematically illustrates a section of photoresist which is formed over a substrate and which is etched.

A section of photoresist which is formed over another substrate and which is etched in the same way is schematically illustrated in FIG. 9.

Photoresist 60 and a mask film 70 are formed in order over a substrate 80. Patterning is performed on the mask film 70 by the use of the photolithography. The photoresist 60 is etched (half-etched) with the mask film 70 on which patterning has been performed as a mask. FIG. 9 illustrates an example of a section of the photoresist 60 at this time. In the example of FIG. 9, a material for and the thickness of the photoresist 60 are the same as a material for and the thickness of the photoresist 60 in the above step illustrated in FIG. 8B. A material for and the thickness of the mask film 70 are the same as a material for and the thickness of the mask film 70 in the above step illustrated in FIG. 8B. Furthermore, the shape and size of an opening formed by patterning are the same as the shape and size of each opening formed in the above step illustrated in FIG. 8B.

As illustrated in FIG. 9, etching progresses further at an end portion of an etched region (trench) 61 of the photoresist 60 than at a central portion of the trench 61. As a result, a subtrench 61a is formed.

The information obtained from FIG. 9 is taken into consideration. When the photoresist 60 is etched in the above step illustrated in FIG. 8B, the photoresist 60 which remains in the via holes 12c at end portions will be thinner than the photoresist 60 which remains in the via hole 12c at a central portion. In a next step illustrated in FIG. 8C, the interlayer insulating film 22b is etched with the photoresist 60 of such thicknesses as a mask. Furthermore, the cover film 22a is etched in a step illustrated in FIG. 8D to form a trench 13c for forming the comparatively wide upper wiring 13. When the interlayer insulating film 22b and the cover film 22a are etched, the photoresist 60 and the anti-reflection coating 50 are also etched.

In the step illustrated in FIG. 8B, the photoresist 60 in the via holes 12c at the end portions becomes thinner than the photoresist 60 in the via hole 12c at the central portion. Therefore, during the following steps illustrated in FIGS. 8C and 8D, portions of the via holes 12c at the end portions which are exposed from the photoresist 60 are larger than a portion of the via hole 12c at the central portion which is exposed from the photoresist 60, and the via holes 12c at the end portions are exposed to an etching environment for a longer time. As a result, the via holes 12c at the end portions will extend in a direction in which edges 13a of the trench 13c extend (or extend outward as a whole), and enlarge further than the via hole 12c at the central portion.

After the via holes 12c and the trench 13c are formed, a determined conductive material, such as Cu, is deposited and the unnecessary conductive material over the interlayer insulating film 22b and the mask film 40 are removed by CMP (Chemical Mechanical Polishing) or the like. By doing so, as illustrated in FIG. 2, the vias 12 and the upper wiring 13 are formed in the via holes 12c and the trench 13c respectively.

If a via hole 12c which has enlarged in the above way reaches only the first lower wiring 11a set to determined potential, then a desired connection structure in which the first lower wiring 11a and the upper wiring 13 are connected by the vias 12 is obtained.

However, if a via hole 12c enlarges significantly, for example, in the direction of the length of the upper wiring 13 (direction (X direction) perpendicular to the direction of the width W1 of the upper wiring 13), then the following may occur. That is to say, a via hole 12c which has enlarged may reach not only the first lower wiring 11a but also the second lower wiring 11b which differs from the first lower wiring 11a in potential, for example, at a Q portion illustrated in FIG. 3. In that case, a via 12 and the upper wiring 13 which are formed by embedding a conductive material in the via hole 12c and the trench 13c, respectively, are connected to both of the first lower wiring 11a and the second lower wiring 11b which differ in potential, and a short circuit occurs.

If the comparatively wide upper wiring 13 is formed and vias 12 are arranged at its end portions, the following method may be adopted for preventing the vias 12 from enlarging to size which leads to a short circuit. That is to say, at the stage of designing the layout of lower wirings 11, vias 12, and an upper wiring 13, vias 12 which are to be arranged at the end portions of the upper wiring 13 and whose enlargement may lead to a short circuit are rearranged on a central portion side so that the vias 12 and the edges 13a of the upper wiring 13 will be a certain distance apart. With the method of rearranging the vias 12 in this way, however, it may be impossible to rearrange a via 12 whose enlargement may lead to a short circuit so that the via 12 and an edge 13a of the upper wiring 13 will be the certain distance apart, depending on the layout of the lower wirings 11.

Figure 10:
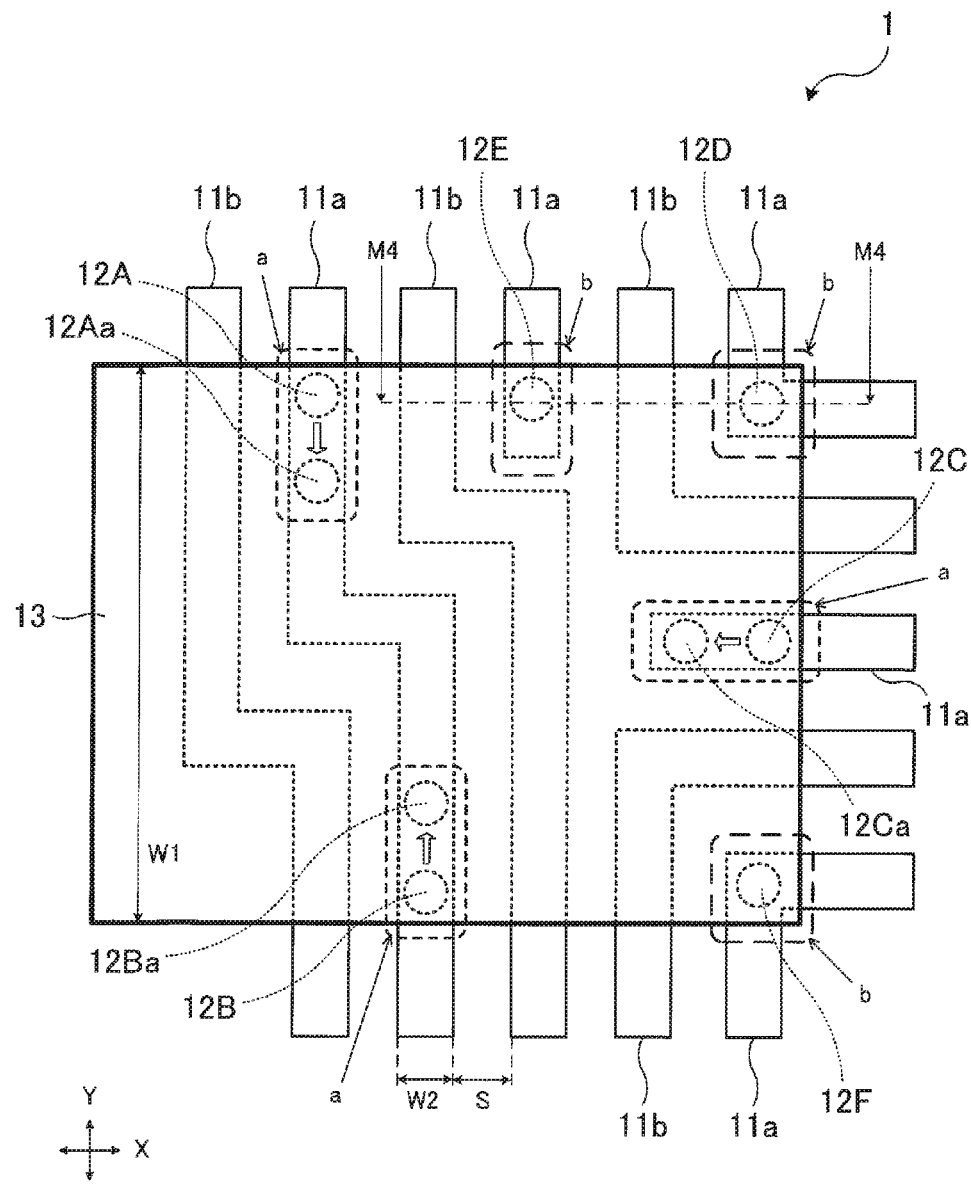
FIG. 10 is a view for describing an example of via rearrangement.
Figure 11:
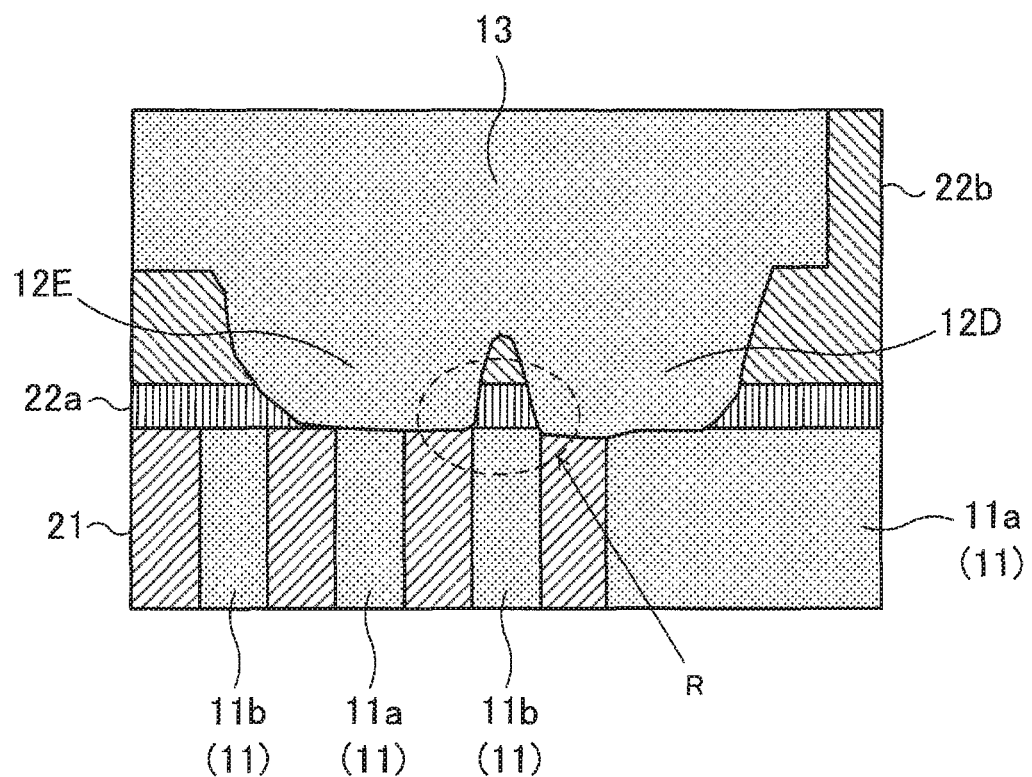
FIG. 11 schematically illustrates an example of a section of a multilayer wiring taken along line M4-M4 of FIG. 10.

FIG. 10 is a view for describing an example of via rearrangement. FIG. 11 schematically illustrates an example of a section of a multilayer wiring taken along line M4-M4 of FIG. 10.

FIG. 10 schematically illustrates an example of the layout of first lower wirings 11a and second lower wirings 11b, which are lower wirings 11, vias 12, and an upper wiring 13. The first lower wirings 11a and the second lower wirings 11b are set to different potentials. Of the first lower wirings 11a and the second lower wirings 11b, the first lower wirings 11a are connected to the upper wiring 13 via six vias 12A through 12F arranged as the vias 12.

In the layout illustrated in FIG. 10, width W2 of the first lower wirings 11a and the second lower wirings 11b is, for example, 0.1 μm and space S between a first lower wiring 11a and a second lower wiring 11b adjacent to each other is, for example, 0.1 μm. Width W1 of the upper wiring 13 is larger than or equal to, for example, 1 μm. All the vias 12A through 12F before rearrangement are end vias. That is to say, distances D between all the vias 12A through 12F before rearrangement and edges 13a of the upper wiring 13 are shorter than or equal to, for example, 0.1 μm. The end vias will now be described. However, one or more vias (not illustrated) may also be arranged in a region nearer a central portion of the upper wiring 13.

Of the end vias before rearrangement, the vias 12A, 12B, and 12C in a regions in FIG. 10 can be rearranged, as illustrated in FIG. 10 as vias 12Aa, 12Ba, and 12Ca respectively, on first lower wirings 11a to which the vias 12A, 12B, and 12C are connected in a region nearer the central portion of the upper wiring 13. Rearranging the vias 12A, 12B, and 12C in this way prevents the vias 12A, 12B, and 12C from enlarging, for example, in the direction (X direction) of the length of the upper wiring 13. This prevents a short circuit between the first lower wirings 11a to which the vias 12A, 12B, and 12C are connected and second lower wirings 11b adjacent thereto.

Of the end vias before rearrangement, on the other hand, the via 12D, 12E, or 12F in a b region in FIG. 10 may not be rearranged in a region nearer the central portion of the upper wiring 13 from the viewpoint of the layout of a first lower wiring 11a to which it is connected. Accordingly, as illustrated in FIG. 11, for example, the formed via 12D or 12E enlarges, for example, in the direction of the length of the upper wiring 13. As a result, the via 12D or 12E which has enlarged may touch not only a first lower wiring 11a but also a second lower wiring 11b adjacent thereto (R portion). When the via 12D or 12E touches a first lower wiring 11a and a second lower wiring 11b set to different potentials, a short circuit occurs. FIG. 11 illustrates the vias 12D and 12E. However, the via 12F illustrated in FIG. 10 also enlarges in the same way and therefore a short circuit may occur.

In order to rearrange the vias 12D, 12E, and 12F in regions nearer the central portion of the upper wiring 13 for preventing them from enlarging, it is desirable to change the layout of the first lower wirings 11a or the first lower wirings 11a and the second lower wirings 11b. Such a change in the layout may contribute to an impediment to an increase in the efficiency or a reduction in the costs of the design and production of the multilayer wiring 1 and a semiconductor device including it.

In consideration of the above problem, the following technique will be adopted for preventing the vias 12 in the multilayer wiring 1 from enlarging and a short circuit due to enlargement of the vias 12.

Figure 12:
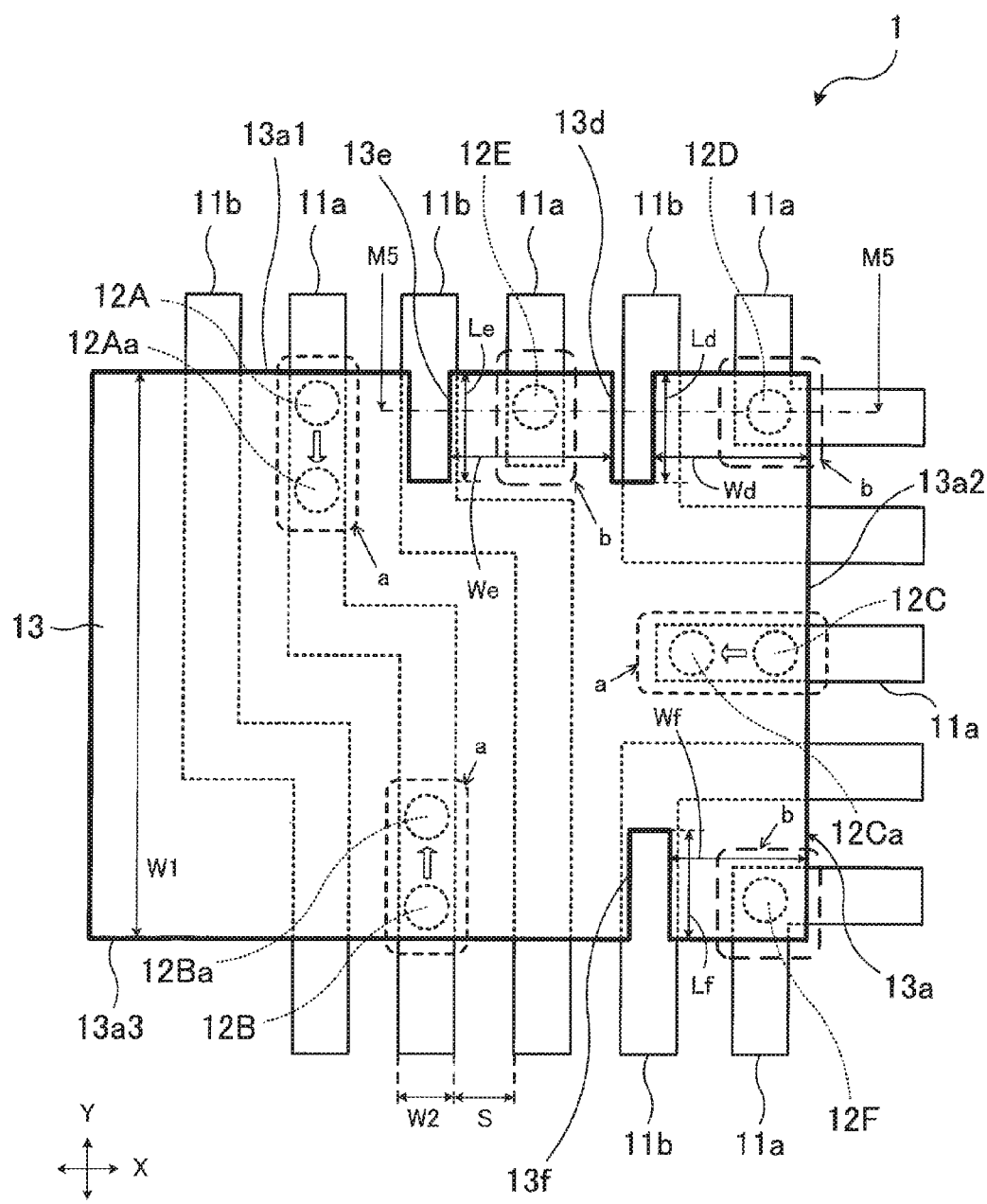
FIG. 12 illustrates an example of the layout of a multilayer wiring.
Figure 13:
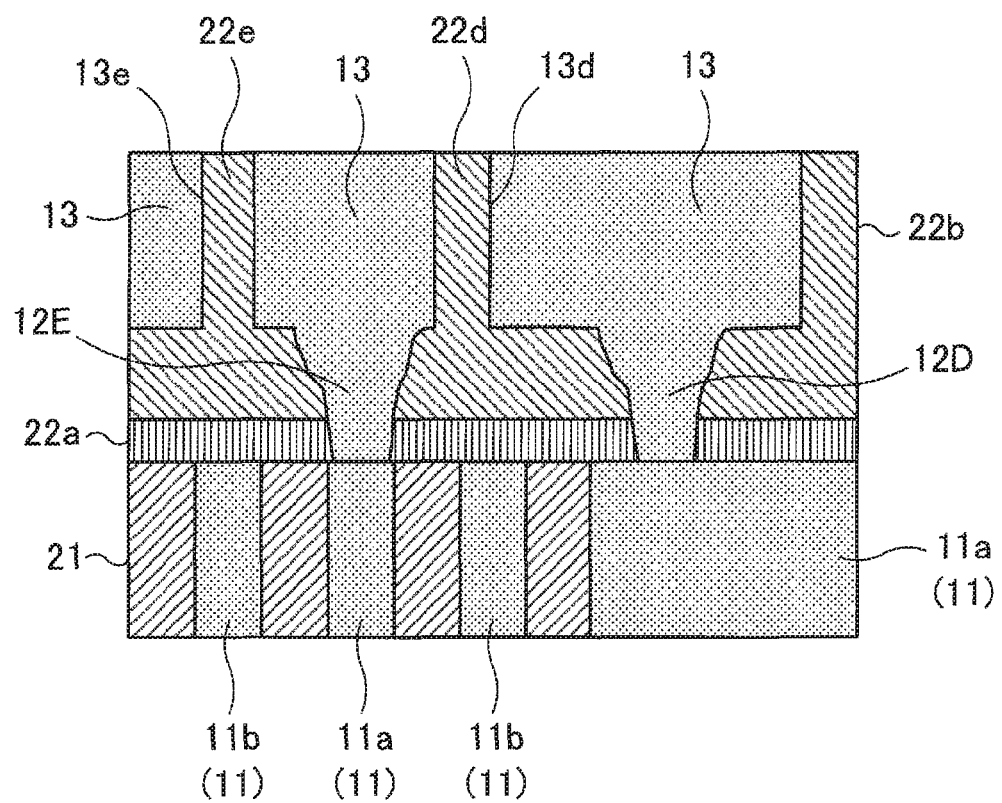
FIG. 13 schematically illustrates an example of a section of the multilayer wiring taken along line M5-M5 of FIG. 12.

FIG. 12 illustrates an example of the layout of a multilayer wiring. FIG. 13 schematically illustrates an example of a section of the multilayer wiring taken along line M5-M5 of FIG. 12.

FIG. 12 schematically illustrates an example of the layout of first lower wirings 11a and second lower wirings 11b set to different potentials, vias 12A through 12F, and an upper wiring 13 connected to the vias 12A through 12F. This is the same with FIG. 10. Width W2 of the first lower wirings 11a and the second lower wirings 11b is, for example, 0.1 μm and space S between a first lower wiring 11a and a second lower wiring 11b adjacent to each other is, for example, 0.1 μm. Width W1 of the upper wiring 13 is larger than or equal to, for example, 1 μm. All the vias 12A through 12F are end vias. That is to say, distances D between all the vias 12A through 12F and edges 13a of the upper wiring 13 are shorter than or equal to, for example, 0.1 μm.

Of the end vias before rearrangement, the vias 12A, 12B, and 12C in a regions in FIG. 12 are rearranged, for example, at the positions of vias 12Aa, 12Ba, and 12Ca, respectively, nearer a central portion of the upper wiring 13 for preventing them from enlarging. This is the same with FIG. 10.

On the other hand, the following method is adopted for preventing the via 12D, 12E, or 12F, of the end vias before rearrangement, which is in a b region in FIG. 12 and which may not be rearranged in a region nearer the central portion of the upper wiring 13 from enlarging.

First the via 12D connected to a corner portion of the upper wiring 13 illustrated in FIG. 12 will be described. The position of the via 12D itself is not changed. A nick portion 13d is formed beside a portion of the upper wiring 13 to which the via 12D is connected. One (edge portion 13a1) of edges 13a of the upper wiring 13 has a shape with the nick portion 13d. As a result, as illustrated in FIG. 13, a slot 22d of an insulating layer 22 is formed in a region in a multilayer wiring 1 corresponding to the nick portion 13d.

The nick portion 13d is formed at a position at which distance (width or wiring width) Wd between the nick portion 13d and one (edge portion 13a2) of the edges 13a opposite the nick portion 13d with the portion of the upper wiring 13 to which the via 12D is connected between is shorter than the width (distance between the edge portion 13a1 and an edge portion 13a3 opposite to each other) W1 of the upper wiring 13. The distance Wd between the nick portion 13d and the edge portion 13a2 is set to, for example, 1 µm or less and is shorter than the width W1 of the upper wiring 13 (which is 1 µm or more). Furthermore, length (length in the direction from the edge portion 13a1 to the edge portion 13a3) Ld of the nick portion 13d is set to, for example, 0.25 µm or more.

If the above nick portion 13d is not formed in the upper wiring 13, the via 12D is one of the end vias at end portions in the direction of the width W1 of the comparatively wide upper wiring 13 whose width is 1 µm or more. The via 12D is arranged at the end portion in the direction of the width W1 of the upper wiring 13, so the via 12D may enlarge (FIG. 6).

On the other hand, if the above nick portion 13d is formed in the upper wiring 13, the via 12D is at the end portion of the upper wiring 13. However, the via 12D is in a region between the nick portion 13d and the edge portion 13a2 whose width Wd is 1 µm or less, that is to say, whose width Wd is comparatively small. Accordingly, the via 12D is considered on a local basis as an end via connected to the upper wiring 13 whose width is Wd. That is to say, if the nick portion 13d is not formed, the width from the via 12D of the upper wiring 13 is W1 which is 1 µm or more and which is comparatively large. On the other hand, if the nick portion 13d is formed, the width from the via 12D of the upper wiring 13 is considered to be Wd which is 1 µm or less and which is comparatively small.

As has been described, the via 12D is at the end portion of the upper wiring 13 and is an end via. By forming the nick portion 13d, however, the width of the upper wiring 13 over the via 12D apparently becomes smaller. This prevents the via 12D from enlarging, for example, in the direction of the width Wd (FIG. 6). Preventing enlargement of the via 12D leads to preventing the via 12D from touching the second lower wiring 11b adjacent on a nick portion 13d side to the first lower wiring 11a under the via 12D and therefore preventing a short circuit.

The via 12F connected to another corner portion of the upper wiring 13 will be described. The position of the via 12F itself is not changed. A nick portion 13f is formed beside a portion of the upper wiring 13 to which the via 12F is connected. This is the same with the via 12D. The edge portion 13a3 of the upper wiring 13 has a shape with the nick portion 13f. As a result, a slot of the insulating layer 22 is formed in a region corresponding to the nick portion 13f.

The nick portion 13f is formed at a position at which distance (width or wiring width) Wf between the nick portion 13f and the edge portion 13a2 opposite the nick portion 13f with the portion at which the via 12F and the upper wiring 13 are connected between is shorter than the width W1 of the upper wiring 13. The distance Wf is set to, for example, 1 µm or less and is shorter than the width W1 of the upper wiring 13 (which is 1 µm or more). Furthermore, length Lf of the nick portion 13f is set to, for example, 0.25 µm or more.

By forming the nick portion 13f in this way, the width of the upper wiring 13 over the via 12F apparently narrows from the width W1 to the width Wf. This prevents the via 12F from enlarging, for example, in the direction of the width Wf (FIG. 6). Preventing enlargement of the via 12F leads to preventing the via 12F from touching the second lower wiring 11b adjacent on a nick portion 13f side to the first lower wiring 11a under the via 12F and therefore preventing a short circuit.

The via 12E connected to an end portion, which is not a corner portion, of the upper wiring 13 illustrated in FIG. 12 will be described. The position of the via 12E itself is not changed. Nick portions which form a pair (nick portions 13d and 13e, in this example) are formed beside a portion of the upper wiring 13 to which the via 12E is connected on both sides of the via 12E. The edge portion 13a1 of the upper wiring 13 has a shape with the nick portions 13d and 13e. As a result, as illustrated in FIG. 13, the slot 22d and a slot 22e of the insulating layer 22 are formed in regions in the multilayer wiring 1 corresponding to the nick portions 13d and 13e respectively.

The nick portion 13e is formed at a position at which distance (width or wiring width) We between the nick portion 13e and the nick portion 13d opposite the nick portion 13e with the portion at which the via 12E and the upper wiring 13 are connected between is shorter than the width W1 of the upper wiring 13. The distance We between the nick portion 13d and the nick portion 13e is set to, for example, 1 µm or less and is shorter than the width W1 of the upper wiring 13 (which is 1 µm or more). Furthermore, length (length in the direction from the edge portion 13a1 to the edge portion 13a3) Le of the nick portion 13e is set to, for example, 0.25 µm or more.

The via 12E is at the end portion of the upper wiring 13. However, the via 12E is in a region between the nick portion 13d and the nick portion 13e whose width We is 1 µm or less, that is to say, whose width We is comparatively small. Accordingly, the via 12E is considered on a local basis as an end via connected to the upper wiring 13 whose width is We.

As has been described, by forming the nick portion 13d and the nick portion 13e which form a pair on both sides of the via 12E, the width of the upper wiring 13 over the via 12E apparently narrows from the width W1 to the width We. This prevents the via 12E from enlarging, for example, in the direction of the width We (FIG. 6). Preventing enlargement of the via 12E leads to preventing the via 12E from touching the second lower wiring 11b adjacent on a nick portion 13d side to the first lower wiring 11a under the via 12E and therefore preventing a short circuit. In addition, preventing enlargement of the via 12E leads to preventing the via 12E from touching the second lower wiring 11b adjacent on a nick portion 13e side to the first lower wiring 11a under the via 12E and therefore preventing a short circuit.

The via 12E is between the nick portion 13e and the nick portion 13d formed because of the presence of the via 12D. The width of the upper wiring 13 over the via 12E is apparently narrowed from the width W1 to the width We. In addition, a pair of nick portions other than the nick portion 13d formed because of the presence of the via 12D may be formed on both sides of the via 12E. By doing so, the width of the upper wiring 13 over the via 12E is apparently narrowed to, for example, 1 μm or less which is smaller than the width W1.

The multilayer wiring 1 including the upper wiring 13 having the above nick portions is formed through, for example, the following procedure. Each process for forming the multilayer wiring 1 will now be described in order with reference to FIGS. 14A through 17B with the structure illustrated in FIGS. 12 and 13 as an example.

Figure 14A:
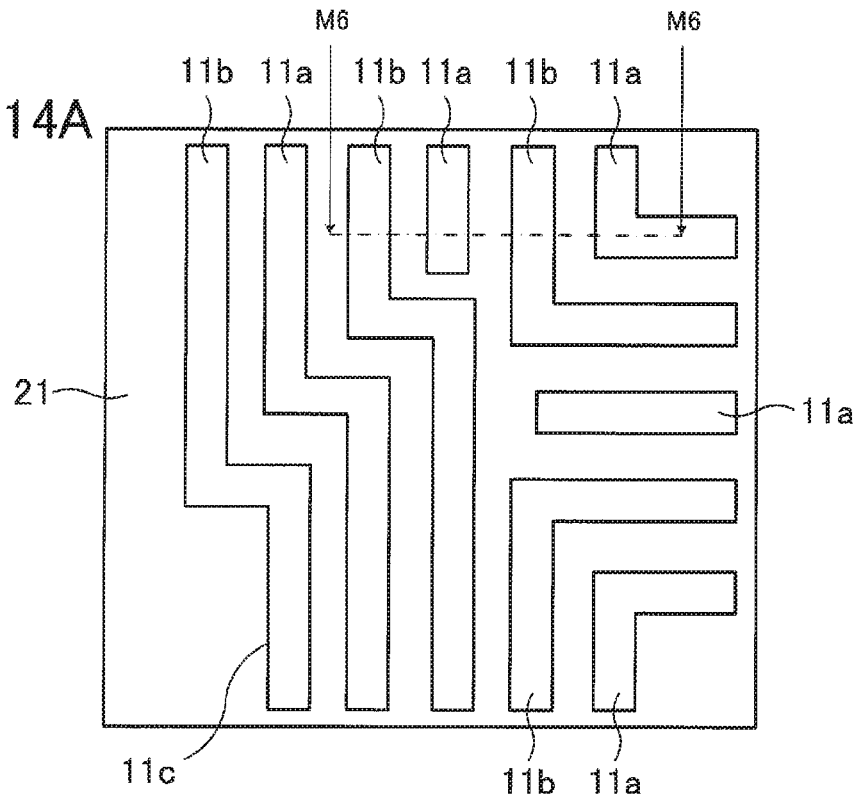
FIGS. 14A and 14B illustrate an example of a lower wiring formation process.
Figure 14B:
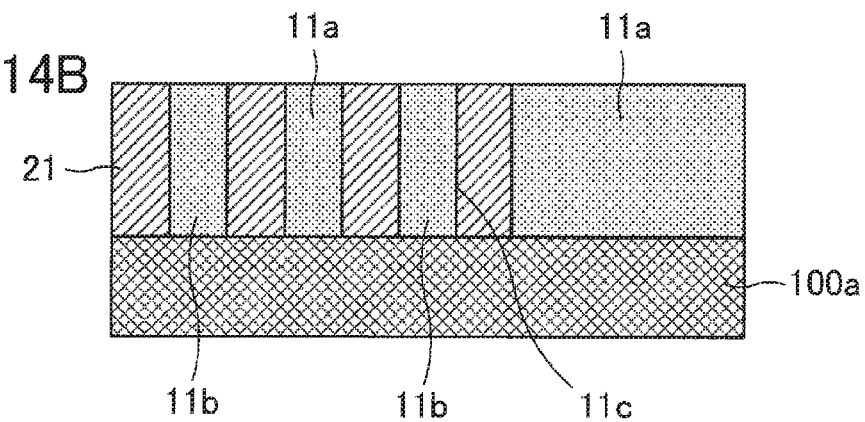

FIGS. 14A and 14B illustrate an example of a lower wiring formation process. FIG. 14A is a fragmentary schematic plan view of an example of a lower wiring formation process. FIG. 14B is a schematic sectional view taken along line M6-M6 of FIG. 14A.

First, as illustrated in FIGS. 14A and 14B, an insulating layer 21 is formed over a determined substrate 100a, a trench 11c is formed in the insulating layer 21, and a determined conductive material, such as Cu, is embedded in the trench 11c. By doing so, first lower wirings 11a and second lower wirings 11b are formed. The above substrate 100 illustrated in FIG. 5, a substrate including the substrate 100, or the like may be used as the substrate 100a. In that case, the first lower wirings 11a and the second lower wirings 11b are electrically connected to the substrate 100 and are set to different potentials.

Figure 15A:
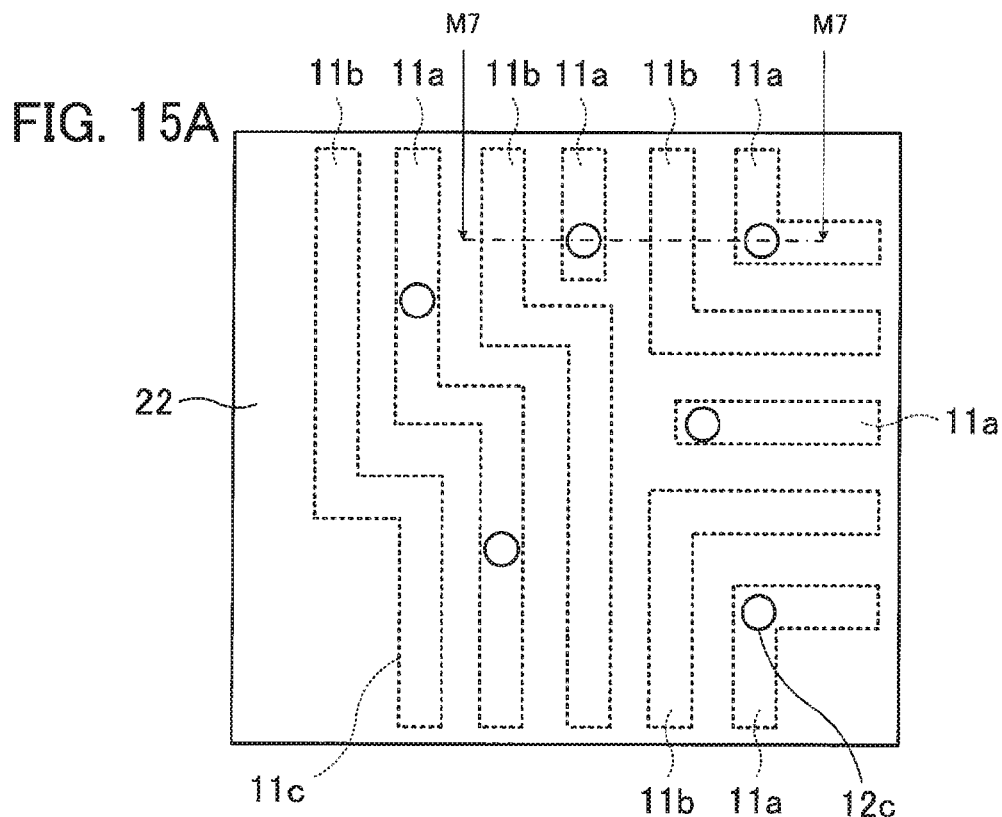
FIGS. 15A and 15B illustrate an example of a via hole formation process.
Figure 15B:
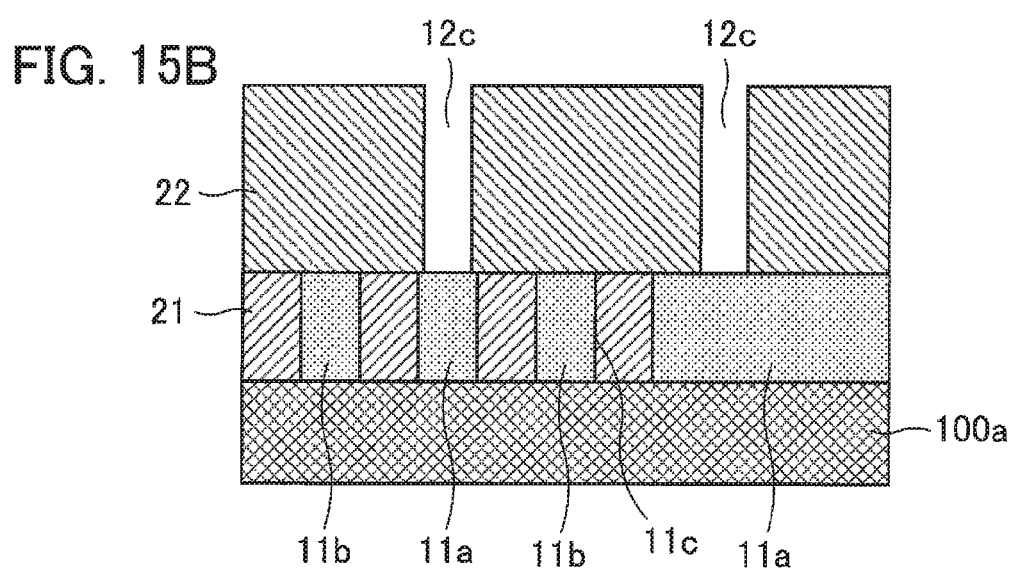

FIGS. 15A and 15B illustrate an example of a via hole formation process. FIG. 15A is a fragmentary schematic plan view of an example of a via hole formation process. FIG. 15B is a schematic sectional view taken along line M7-M7 of FIG. 15A.

After the formation of the first lower wirings 11a and the second lower wirings 11b, as illustrated in FIGS. 15A and 15B, an insulating layer 22 is formed over the insulating layer 21 in which the first lower wirings 11a and the second lower wirings 11b are formed. After that, via holes 12c which reach the first lower wirings 11a are formed in the formed insulating layer 22 by the photolithography and etching. FIG. 15A illustrates the via holes 12c for forming the above vias 12Aa, 12Ba, 12Ca, 12D, 12E, and 12F.

FIGS. 16A and 16B illustrate an example of a trench formation process. FIG. 16A is a fragmentary schematic plan view of an example of a trench formation process. FIG. 16B is a schematic sectional view taken along line M8-M8 of FIG. 16A.

After the formation of the via holes 12c, as illustrated in FIGS. 16A and 16B, a trench 13c for an upper wiring 13 which communicates with the via holes 12c is formed by the photolithography and etching in the insulating layer 22 in which the via holes 12c are formed. The formed trench 13c has edges at which nick portions 13d, 13e, and 13f are formed beside via holes 12c, of the via holes 12c, for forming the above vias 12D, 12E, and 12F.

If the trench 13c whose edges have the above shapes is formed, the width of the trench 13c formed over the via hole 12c used for forming the via 12D apparently narrows to width Wd which is 1 μm or less and which is smaller than wiring width W1. Furthermore, the width of the trench 13c formed over the via hole 12c used for forming the via 12E apparently narrows to width We which is 1 μm or less and which is smaller than the wiring width W1. In addition, the width of the trench 13c formed over the via hole 12c used for forming the via 12F apparently narrows to width Wf which is 1 μm or less and which is smaller than the wiring width W1.

The width of the trench 13c formed over a via hole 12c used for forming each of the vias 12D, 12E, and 12F apparently narrows in this way. This prevents each via hole 12c from enlarging and the formation of a via hole 12c which reaches a second lower wiring 11b is avoided.

Figure 17A:
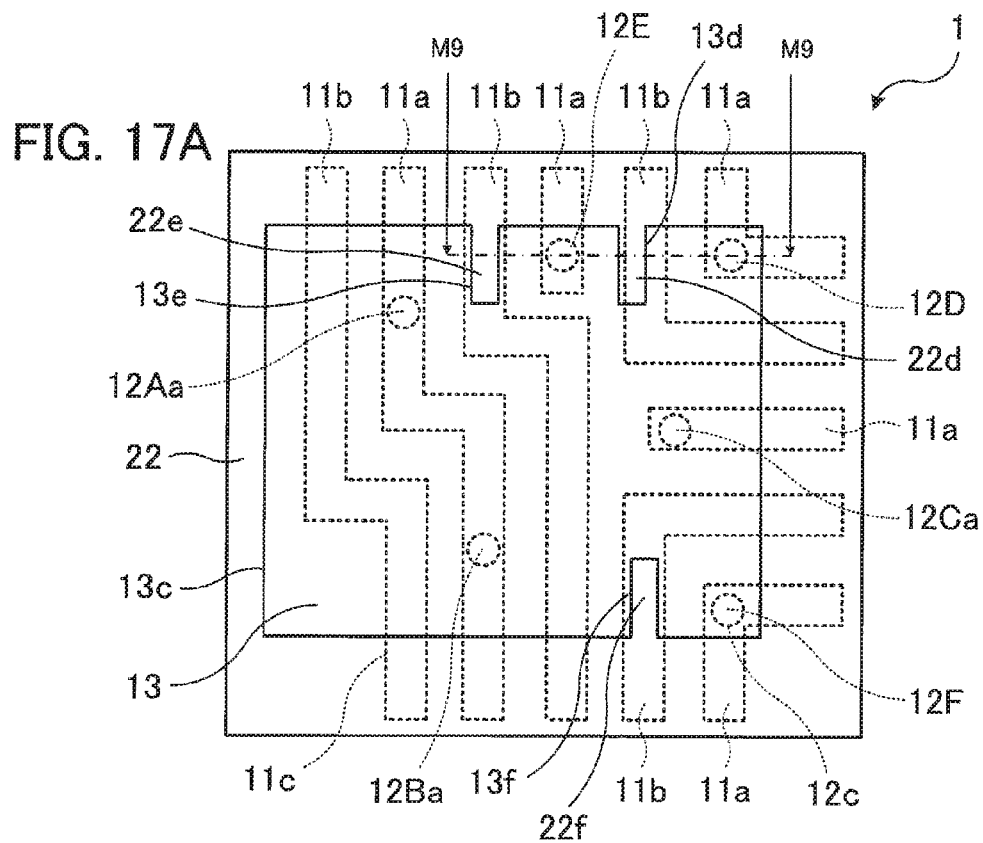
FIGS. 17A and 17B illustrate an example of a conductive material formation process.
Figure 17B:
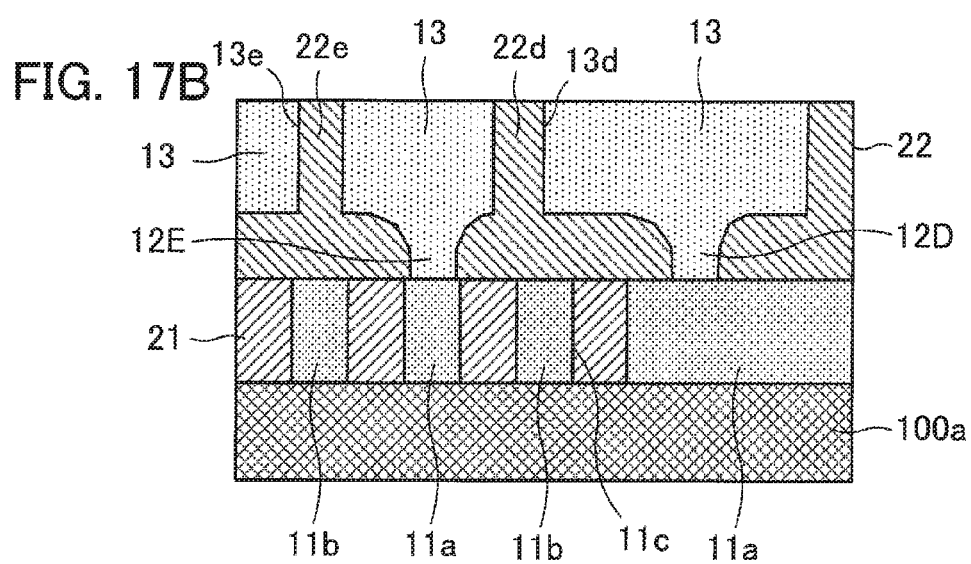

FIGS. 17A and 17B illustrate an example of a conductive material formation process. FIG. 17A is a fragmentary schematic plan view of an example of a conductive material formation process. FIG. 17B is a schematic sectional view taken along line M9-M9 of FIG. 17A.

After the formation of the trench 13c having the nick portions 13d, 13e, and 13f, as illustrated in FIGS. 17A and 17B, a determined conductive material, such as Cu, is embedded in the via holes 12c and the trench 13c. By doing so, the vias 12Aa, 12Ba, 12Ca, 12D, 12E, and 12F and the upper wiring 13 are formed. For example, a conductive material is deposited in the via holes 12c and the trench 13c and the unnecessary conductive material over the insulating layer 22 is removed by the CMP. By doing so, the vias 12Aa, 12Ba, 12Ca, 12D, 12E, and 12F and the upper wiring 13 are formed. Regions of the upper wiring 13 corresponding to the nick portions 13d, 13e, and 13f are slots 22d, 22e, and 22f, respectively, of the insulating layer 22.

The multilayer wiring 1 is formed in this way over the determined substrate 100a including semiconductor elements, and a semiconductor device is formed.

The above technique prevents each via hole 12c from enlarging, and the formation of a via hole 12c which reaches a second lower wiring 11b adjacent to a first lower wiring 11a to which the via hole 12c is connected is avoided. That is to say, the above technique prevents the vias 12D, 12E, and 12F at the end portions of the upper wiring 13 from touching the second lower wirings 11b, and therefore prevents a short circuit. The above technique also prevents the vias 12Aa, 12Ba, and 12Ca at the positions nearer the central portion of the upper wiring 13 from touching the second lower wirings 11b, and therefore prevents a short circuit.

Barrier metal films (not illustrated) may be formed on inner walls of the above trenches 11c, via holes 12c, and trench 13c by the use of Ta, Ti, tantalum nitride, titanium nitride, or the like.

Next, the arrangement and size of the above nick portions formed in the upper wiring 13 of the multilayer wiring 1 will be described.

Figure 18:
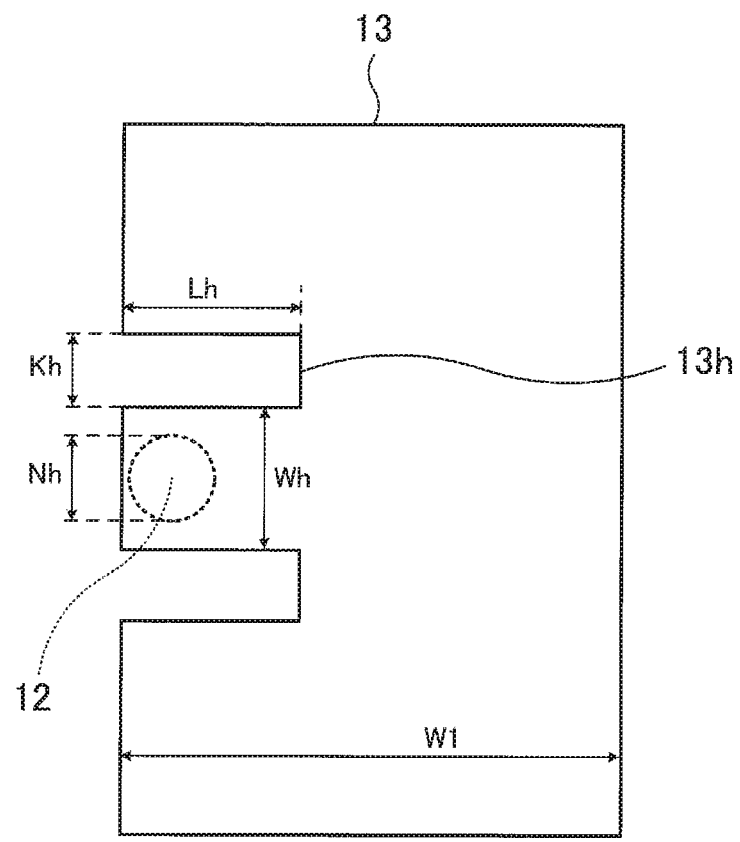
FIG. 18 illustrates an example of a layout.

FIG. 18 illustrates an example of a layout.

FIG. 18 illustrates a via 12 and the upper wiring 13 having an edge at which nick portions (slots) 13h that form a pair are formed on both sides of a portion of the upper wiring 13 to which the via 12 is connected. In this case, it is assumed that the distance between the nick portions 13h is Wh, that the length of each nick portion 13h is Lh, that the width of each nick portion 13h is Kh, that the diameter of the via 12 is Nh, and that the width of the upper wiring 13 is W1.

Figure 19:
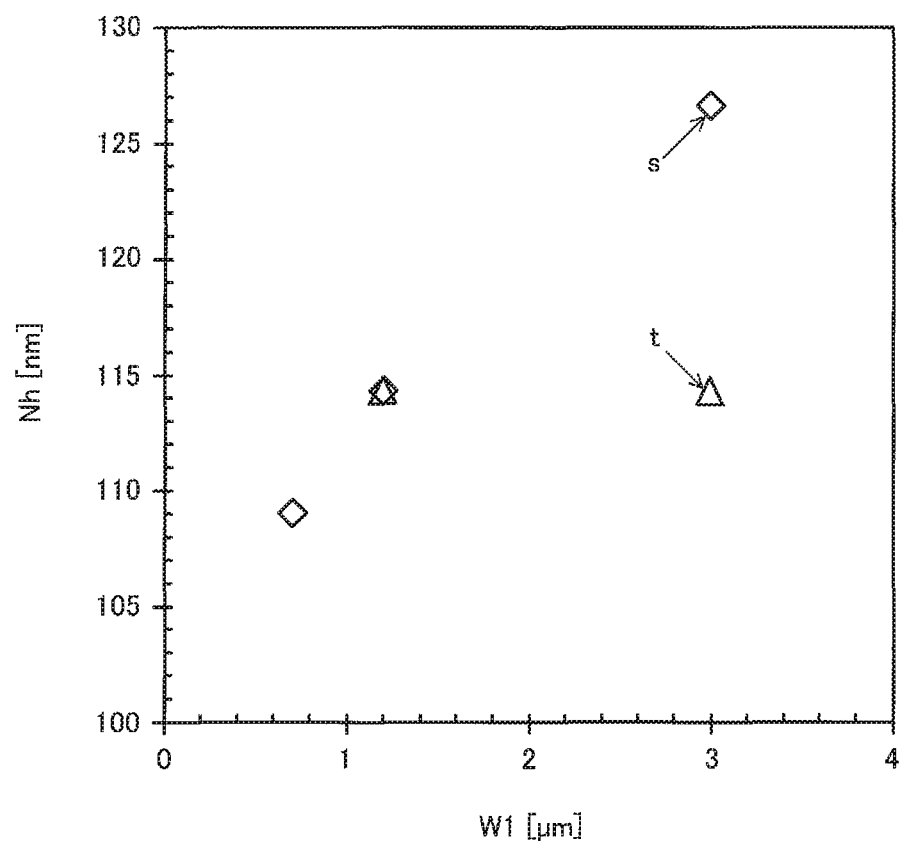
FIG. 19 indicates an example of the relationship between the width of an upper wiring and the diameter of a via.

FIG. 19 indicates an example of the relationship between the width of the upper wiring and the diameter of the via.

For example, a design value of the diameter Nh of the via 12 is set to 90 nm, a design value of the width W1 of the upper wiring 13 is set to 3 μm, and the via 12 and the upper wiring 13 are formed. From FIG. 19, if the nick portions 13h are not formed in the upper wiring 13 (s in FIG. 19), the diameter Nh of the via 12 formed is about 127 nm. On the other hand, if the nick portions 13h for which a design value of the distance Wh is 180 nm, for which a design value of the length Lh is 250 nm, and for which a design value of the width Kh is 90 nm are formed in the upper wiring 13 (t in FIG. 19), the diameter Nh of the via 12 formed is about 114 nm. If these nick portions 13h are formed, the degree of enlargement of the via 12 is small compared with the case where the nick portions 13h are not formed.

Figure 20:
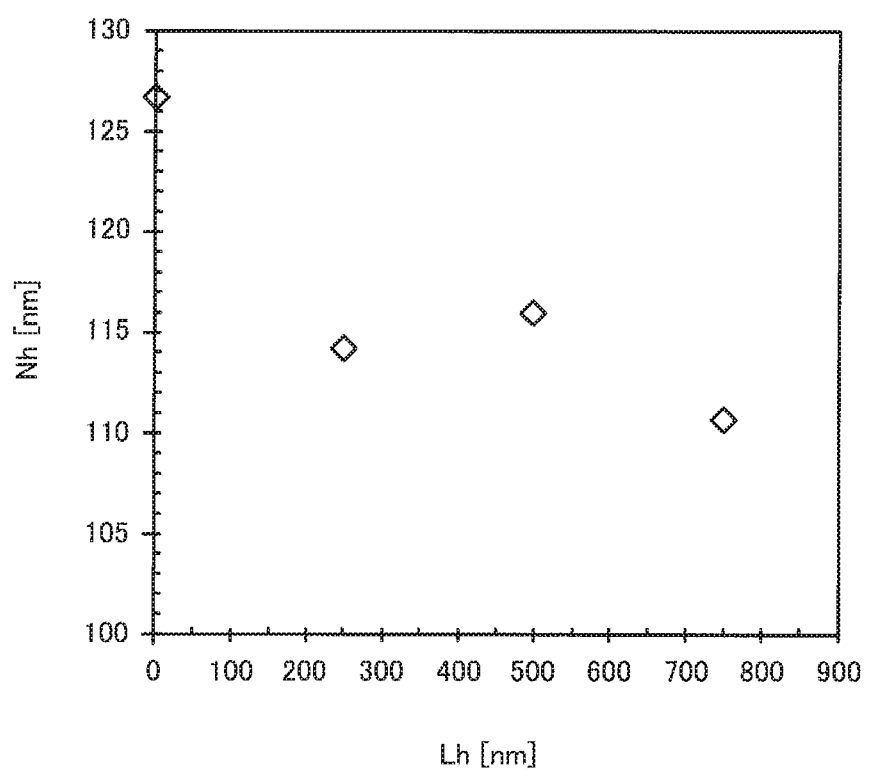
FIG. 20 indicates an example of the relationship between the length of nick portions and the diameter of a via.

FIG. 20 indicates an example of the relationship between the length of the nick portions and the diameter of the via.

A design value of the diameter Nh of the via 12 is set to 90 nm, a design value of the width W1 of the upper wiring 13 is set to 3 µm, and the via 12 and the upper wiring 13 are formed. From FIG. 20, if the nick portions 13h are not formed in the upper wiring 13 (length Lh=0), the diameter Nh of the via 12 formed is about 127 nm. On the other hand, if the nick portions 13h for which a design value of the distance Wh is 180 nm, for which a design value of the width Kh is 90 nm, and for which design values of the length Lh are 250, 500, and 750 nm are formed in the upper wiring 13, the diameters Nh of the via 12 formed are about 114, 116, and 111 nm respectively. If the nick portions 13h for which a design value of the length Lh is 250 nm or more are formed, the degree of enlargement of the via 12 is small compared with the case where the nick portions 13h are not formed.

Figure 21:
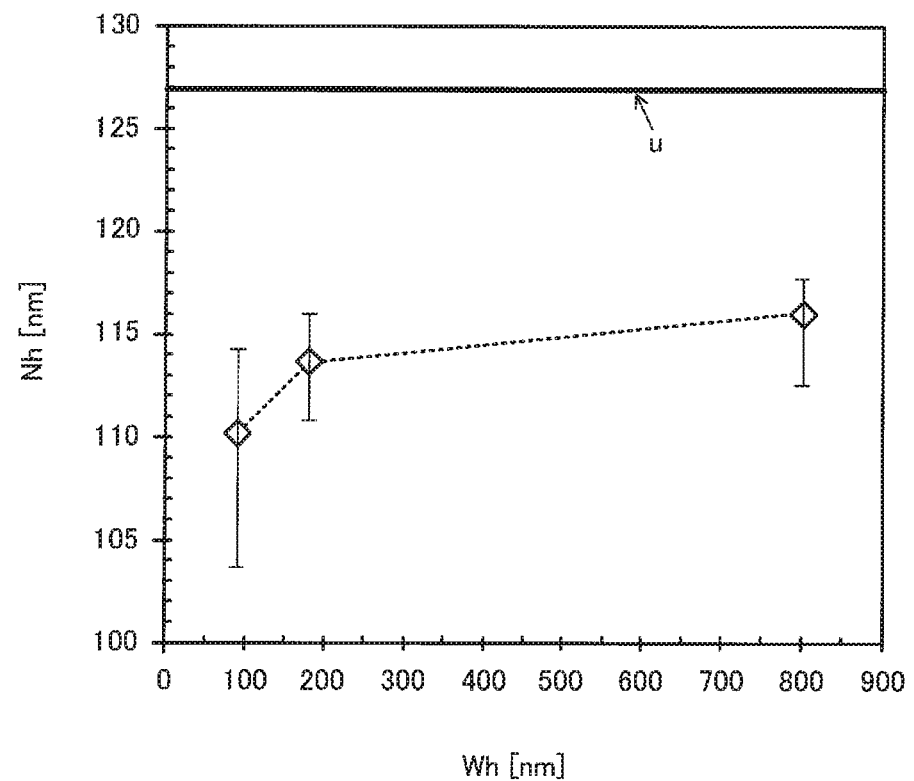
FIG. 21 indicates an example of the relationship between the distance between nick portions and the diameter of a via.

FIG. 21 indicates an example of the relationship between the distance between the nick portions and the diameter of the via.

A design value of the diameter Nh of the via 12 is set to 90 nm, a design value of the width W1 of the upper wiring 13 is set to 3 µm, and the via 12 and the upper wiring 13 are formed. The nick portions 13h for which a design value of the width Kh is 90 nm, for which a design value of the length Lh is 250 nm, and for which design values of the distance Wh are 90, 180, and 800 nm are formed in the upper wiring 13. From FIG. 21, if the nick portions 13h for which a design value of the distance Wh is 800 nm or less are formed, the degree of enlargement of the via 12 is small compared with a case where the nick portions 13h are not formed (line u in FIG. 21 indicative of enlargement of the via 12).

Figure 22:
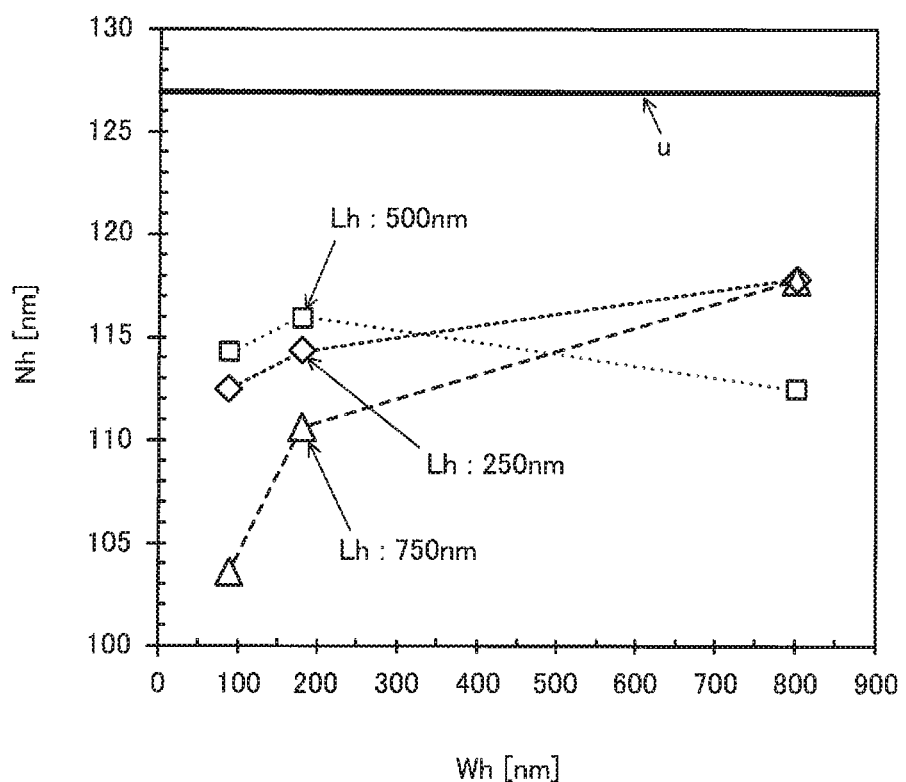
FIG. 22 indicates an example of the relationship between the distance between nick portions and the diameter of a via according to lengths of the nick portions.

FIG. 22 indicates an example of the relationship between the distance between the nick portions and the diameter of the via according to lengths of the nick portions.

A design value of the diameter Nh of the via 12 is set to 90 nm, a design value of the width W1 of the upper wiring 13 is set to 3 µm, and the via 12 and the upper wiring 13 are formed. The nick portions 13h for which a design value of the width Kh is 90 nm, for which a design value of the length Lh is 250 nm, and for which design values of the distance Wh are 90, 180, and 800 nm are formed in the upper wiring 13. Furthermore, the nick portions 13h for which a design value of the width Kh is 90 nm, for which a design value of the length Lh is 500 nm, and for which design values of the distance Wh are 90, 180, and 800 nm are formed in the upper wiring 13. In addition, the nick portions 13h for which a design value of the width Kh is 90 nm, for which a design value of the length Lh is 750 nm, and for which design values of the distance Wh are 90, 180, and 800 nm are formed in the upper wiring 13. From FIG. 22, if the nick portions 13h for which a design value of the distance Wh is 800 nm or less are formed, the degree of enlargement of the via 12 is small compared with a case where the nick portions 13h are not formed (line u in FIG. 22 indicative of enlargement of the via 12). This applies to all the cases where design values of the length Lh of the nick portions 13h are 250, 500, and 750 nm.

As can be seen from the descriptions of FIGS. 18 through 22, forming the nick portions 13h of determined size at determined positions beside the portion of the upper wiring 13 to which the via 12 is connected prevents the via 12 from enlarging.

A process for designing the multilayer wiring 1 will now be described.

Figure 23:
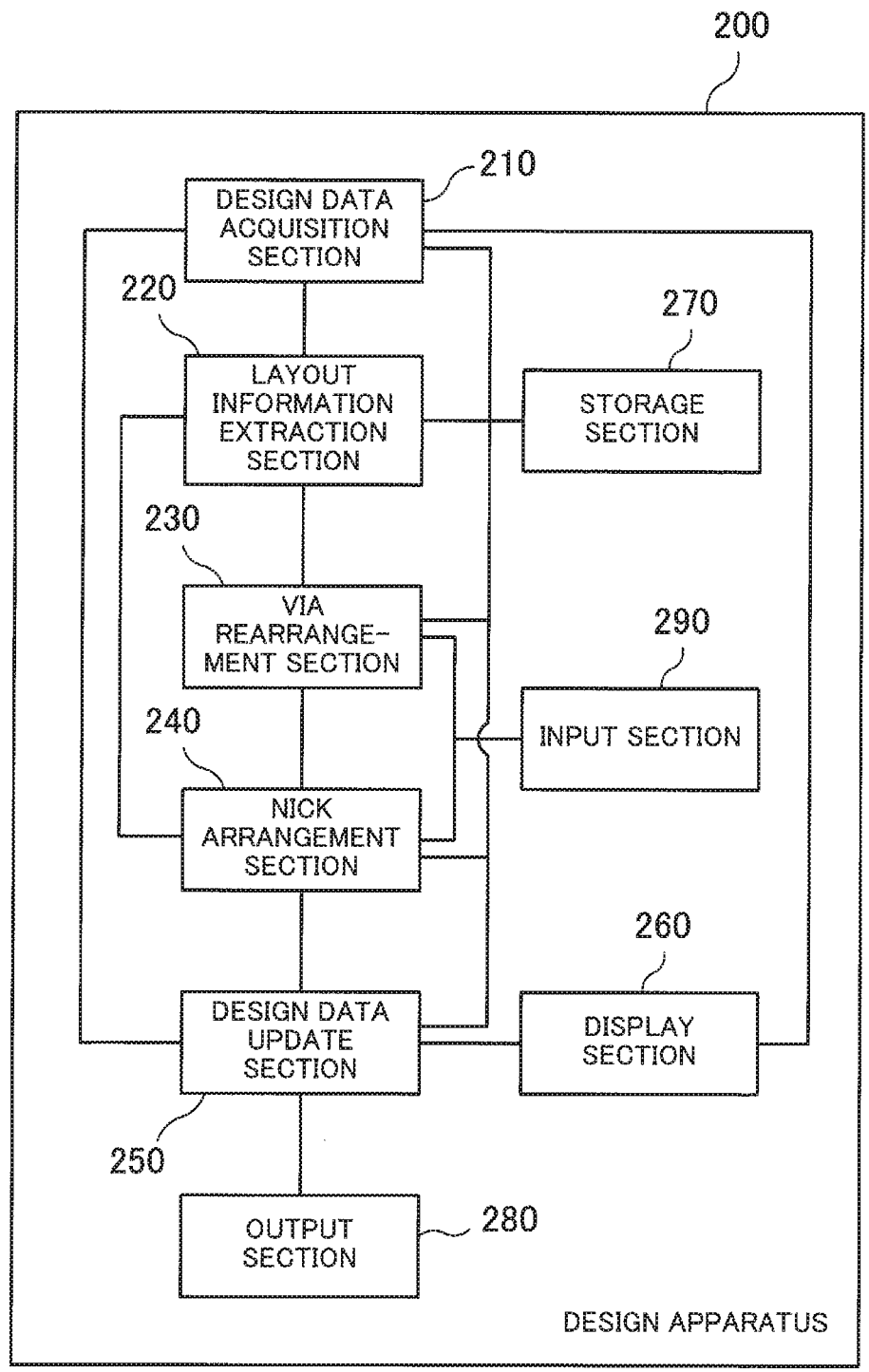
FIG. 23 illustrates an example of a design apparatus.

FIG. 23 illustrates an example of a design apparatus.

A design apparatus 200 illustrated in FIG. 23 includes a design data acquisition section 210, a layout information extraction section 220, a via rearrangement section 230, a nick arrangement section 240, and a design data update section 250.

The design data acquisition section 210 acquires design data including information indicative of the layout of lower wirings 11 (first lower wirings 11a and second lower wirings 11b), vias 12, and upper wirings 13. For example, the design data acquisition section 210 acquires design data including information indicative of the above layout which is illustrated in FIG. 10 and which is determined on the basis of conventional design rules.

The layout information extraction section 220 extracts from design data acquired by the design data acquisition section 210 information indicative of the layout of a determined upper wiring 13 and vias 12 and lower wirings 11 (first lower wirings 11a) connected to the upper wiring 13.

The via rearrangement section 230 rearranges end vias, of vias 12 included in information extracted by the layout information extraction section 220, which are arranged at end portions of an upper wiring 13 and which can be rearranged from the viewpoint of the layout of first lower wirings 11a.

The nick arrangement section 240 arranges nick portions in an upper wiring 13 beside end vias, of vias 12 included in information extracted by the layout information extraction section 220, which are arranged at end portions of the upper wiring 13 and which may not be rearranged from the viewpoint of the layout of first lower wirings 11a. Alternatively, the nick arrangement section 240 arranges nick portions in an upper wiring 13 beside end vias, of vias 12 included in information extracted by the layout information extraction section 220, which are arranged at end portions of the upper wiring 13.

The design data update section 250 updates design data acquired by the design data acquisition section 210 by the use of information indicative of the layout of vias 12 rearranged by the via rearrangement section 230 and an upper wiring 13 in which nick portions are arranged by the nick arrangement section 240.

The design apparatus 200 illustrated in FIG. 23 further includes a display section 260, a storage section 270, an output section 280, and an input section 290.

The display section 260 displays on a monitor or the like a layout indicated by design data acquired by the design data acquisition section 210 or a layout indicated by design data updated by the design data update section 250.

The storage section 270 stores design data acquired by the design data acquisition section 210 or design data updated by the design data update section 250. The storage section 270 also stores various pieces of data which are generated or used while the design data updated by the design data update section 250 is obtained from the design data acquired by the design data acquisition section 210.

The output section 280 outputs design data updated by the design data update section 250 to various record media and other apparatus (such as a server computer and a semiconductor manufacturing apparatus).

An operator inputs conditions required for a design process, such as design rules applied to end via rearrangement and the size of nick portions arranged in an upper wiring 13, to the design apparatus 200 by the use of the input section 290.

Next, an example of the flow of a process for designing the multilayer wiring 1 by the use of the above design apparatus 200 will be described. An example of the flow of a design process performed by the use of the design apparatus 200 will now be described with the layout of the multilayer wiring 1 illustrated in FIG. 12 as an example.

Figure 24:
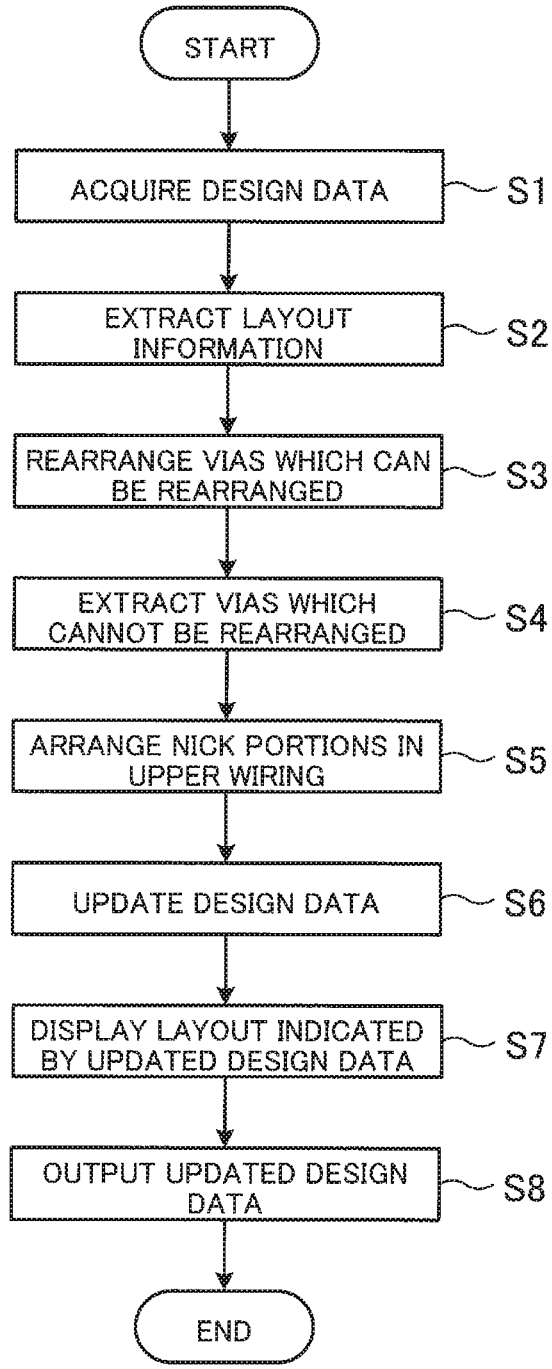
FIG. 24 indicates an example of the flow of a design process.

FIG. 24 indicates an example of the flow of a design process.

First the design data acquisition section 210 acquires design data including information indicative of the layout of lower wirings 11 (first lower wirings 11*a* and second lower wirings 11*b*), vias 12, and upper wirings 13 (step S1). The design data acquired in this step includes information indicative of the layout of the vias 12A, 12B, and 12C before rearrangement as the vias 12 and the layout of a via group including the vias 12D, 12E, and 12F as the vias 12. That is to say, in step S1, design data including information indicative of the layout illustrated in FIG. 10 is acquired. This design data is generated on the basis of, for example, conventional design rules.

The layout information extraction section 220 then extracts from the acquired design data information indicative of the layout of an upper wiring 13 whose width W1 is greater than or equal to a determined value (1 μm, for example) and vias 12 and first lower wirings 11*a* connected to the upper wiring 13 (step S2).

The via rearrangement section 230 then changes the layout of end vias, of the vias 12 included in the information extracted by the layout information extraction section 220, which are arranged at end portions of the upper wiring 13 and which can be rearranged (step S3). In this case, the design rule regarding restriction of arrangement that if the width W1 of an upper wiring 13 is greater than or equal to a determined value (1 μm, for example), a via 12 is not arranged in a region within a determined value (0.1 μm, for example) from its edge 13*a* is applied. On the basis of this design rule, vias 12, of end vias, which can be rearranged in regions nearer a central portion of the upper wiring 13 from the viewpoint of the layout of the first lower wirings 11*a*, that is to say, the vias 12A, 12B, and 12C in this example are rearranged at the positions of the above vias 12Aa, 12Ba, and 12Ca illustrated in FIG. 12.

When or after the vias 12 which can be rearranged are rearranged, the nick arrangement section 240 extracts information indicative of the layout of vias which may not be rearranged in regions nearer the central portion of the upper wiring 13 from the viewpoint of the layout of the first lower wirings 11*a* (step S4). That is to say, in this example, the nick arrangement section 240 extracts information indicative of the layout of the above vias 12D, 12E, and 12F illustrated in FIG. 12.

The nick arrangement section 240 arranges nick portions at determined positions in the upper wiring 13 by the use of the extracted information indicative of the layout of the vias 12 which may not be rearranged and the extracted information indicative of the layout of the upper wiring 13 (step S5). That is to say, in this example, as illustrated in FIG. 12, the nick arrangement section 240 arranges the nick portion 13*d* beside the portion of the upper wiring 13 to which the via 12D is connected opposite the edge portion 13*a*2 with the via 12D between. Furthermore, the nick arrangement section 240 arranges the nick portion 13*e* beside the portion of the upper wiring 13 to which the via 12E is connected opposite the nick portion 13*d* with the via 12E between. In addition, the nick arrangement section 240 arranges the nick portion 13*f* beside the portion of the upper wiring 13 to which the via 12F is connected opposite the edge portion 13*a*2 with the via 12F between. The positions and sizes of the nick portions 13*d*, 13*e*, and 13*f* are set on the basis of the information described in FIGS. 18 through 22.

The formation of the nick portions 13*d*, 13*e*, and 13*f* in the upper wiring 13 apparently narrows the width of the upper wiring 13 over the vias 12D, 12E, and 12F, respectively, to a value (1 μm or less, for example) and prevents the vias 12D, 12E, and 12F, respectively, from enlarging.

By performing steps S2 through S5, information indicative of the layout of the rearranged vias 12Aa, 12Ba, and 12Ca and the upper wiring 13 in which the nick portions 13*d*, 13*e*, and 13*f* are arranged is obtained. The design data update section 250 updates the design data acquired in step S1 by the use of the information indicative of the layout (step S6). The display section 260 displays on the monitor or the like a layout indicated by updated design data (step S7). In addition, the output section 280 outputs the updated design data (step S8).

The multilayer wiring 1 is formed by the use of the design data updated in this way in accordance with the examples illustrated in FIGS. 14A through 17B, and a semiconductor device is formed.

With the flow of the design process indicated in FIG. 24, the vias, of the vias 12 arranged at the end portions of the upper wiring 13, which can be rearranged in regions nearer the central portion of the upper wiring from the viewpoint of the layout of the first lower wirings 11*a* are rearranged and the nick portions are formed in the upper wiring 13 for the vias, of the vias 12 arranged at the end portions of the upper wiring 13, which may not be rearranged. In addition, the multilayer wiring 1 may be designed in accordance with a flow indicated in FIG. 25.

Figure 25:
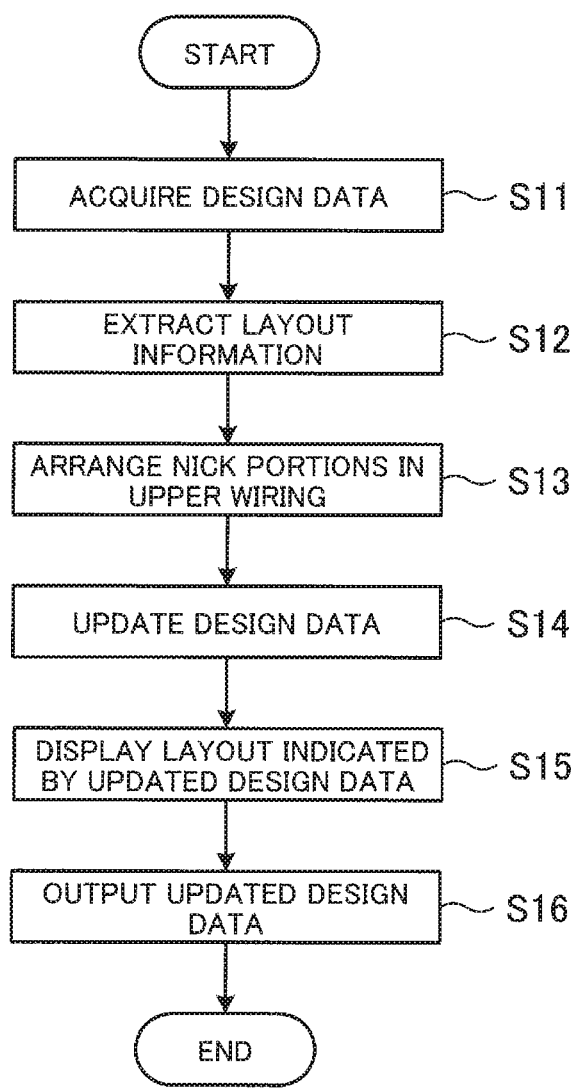
FIG. 25 indicates another example of the flow of a design process.

FIG. 25 indicates another example of the flow of a design process.

First the design data acquisition section 210 acquires design data including information indicative of the layout of lower wirings 11, vias 12, and upper wirings 13 like that illustrated in FIG. 10 (step S11). This is the same with the above step S1 indicated in FIG. 24. The layout information extraction section 220 then extracts from the acquired design data information indicative of the layout of an upper wiring 13 whose width W1 is greater than or equal to a determined value and vias 12 and first lower wirings 11*a* connected to the upper wiring 13 (step S12). This is the same with the above step S2 indicated in FIG. 24.

With the design process indicated in FIG. 25, the nick arrangement section 240 then arranges nick portions at determined positions in the upper wiring 13 for vias 12 at end portions of the upper wiring 13 included in the extracted information, that is to say, for the vias 12A, 12B, 12C, 12D, 12E, and 12F (step S13). The nick arrangement section 240 arranges the nick portions 13*d*, 13*e*, and 13*f* for the vias 12D, 12E, and 12F, respectively, in the way described in the above step S5 indicated in FIG. 24. Similarly, the nick arrangement section 240 arranges nick portions for the vias 12A, 12B, and 12C at determined positions beside portions of the upper wiring 13 to which the vias 12A, 12B, and 12C are connected so that the width of the upper wiring 13 over the vias 12A, 12B, and 12C will apparently narrow to a value (1 μm or less, for example).

The design data update section 250 acquires information regarding the upper wiring 13 in which the nick portions are arranged in this way, and updates the design data acquired in step S11 by the use of the information (step S14). The display section 260 displays on the monitor or the like a layout indicated by updated design data (step S15). In addition, the output section 280 outputs the updated design data (step S16).

The multilayer wiring 1 is formed by the use of the design data updated in this way in accordance with the examples illustrated in FIGS. 14A through 17B, and a semiconductor device is formed.

With the flow of the design process indicated in FIG. 25, the nick portions are arranged in the upper wiring 13 for the vias 12 arranged at the end portions of the upper wiring 13 regardless of whether the vias 12 arranged at the end portions of the upper wiring 13 can be rearranged from the viewpoint of the layout of the first lower wirings 11a. The multilayer wiring 1 in which enlargement of the vias 12 is prevented may be formed in accordance with the above flow of the design process.

A computer may be used as the design apparatus 200 used for performing the above design process.

Figure 26:
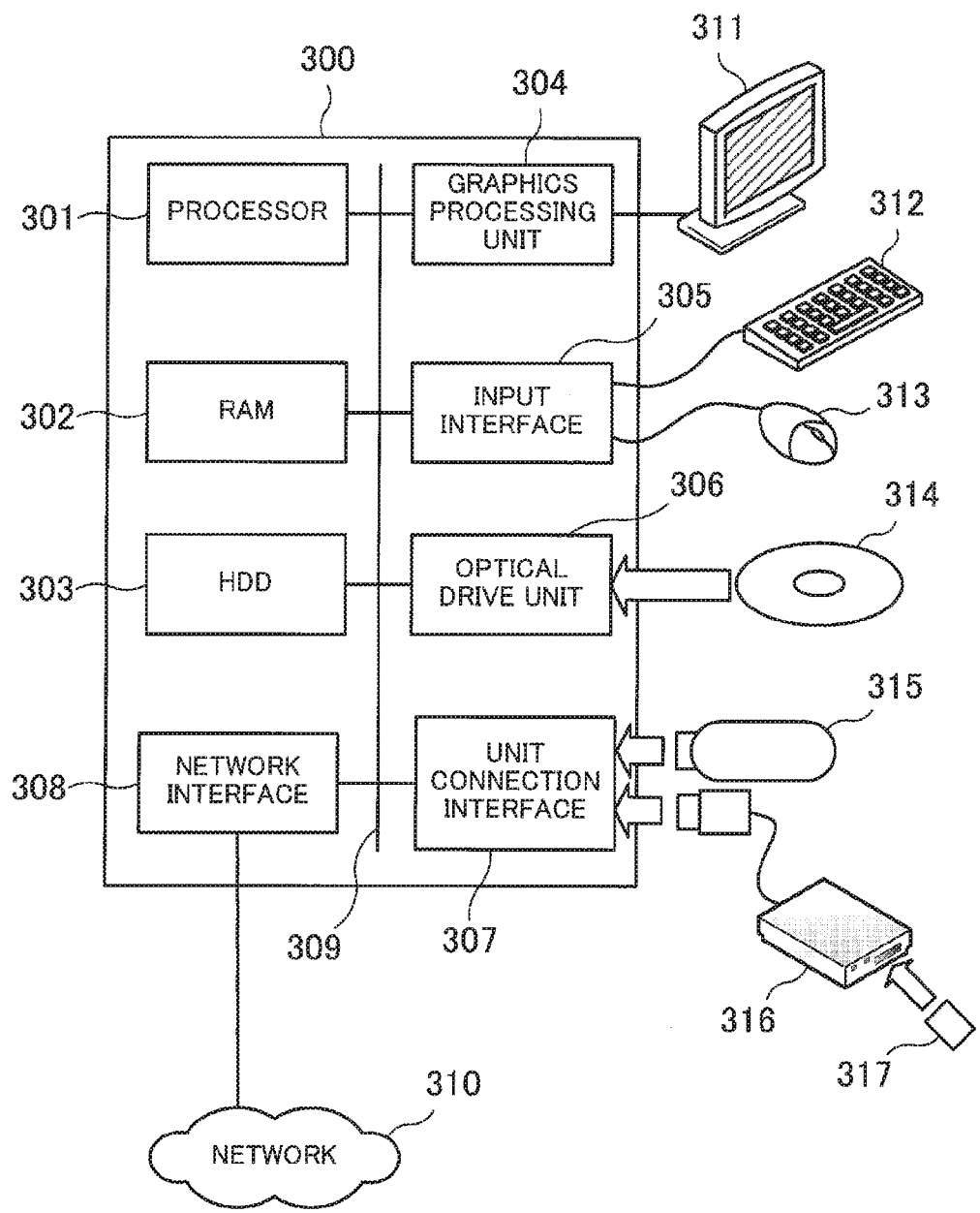
FIG. 26 illustrates an example of the hardware configuration of a computer.

FIG. 26 illustrates an example of the hardware configuration of a computer.

The whole of a computer 300 is controlled by a processor 301. A RAM (Random Access Memory) 302 and a plurality of peripheral units are connected to the processor 301 via a bus 309. The processor 301 may be a multiprocessor. The processor 301 is a CPU (Central Processing Unit), a MPU (Micro Processing Unit), a DSP (Digital Signal Processor), an ASIC (Application Specific Integrated Circuit), a PLD (Programmable Logic Device), or the like. Furthermore, the processor 301 may be a combination of two or more of a CPU, a MPU, a DSP, an ASIC, and a PLD.

The RAM 302 is used as main storage of the computer 300. The RAM 302 temporarily stores at least a part of an OS (Operating System) program or an application program executed by the processor 301. In addition, the RAM 302 stores various pieces of data which the processor 301 needs to perform a process.

The plurality of peripheral units connected to the bus 309 are a HDD (Hard Disk Drive) 303, a graphics processing unit 304, an input interface 305, an optical drive unit 306, a unit connection interface 307, and a network interface 308.

The HDD 303 magnetically writes data to and reads out data from a built-in disk. The HDD 303 is used as auxiliary storage of the computer 300. The HDD 303 stores the OS program, application programs, and various pieces of data. A semiconductor memory, such as a flash memory, may be used as auxiliary storage.

A monitor, such as a liquid crystal display, 311 is connected to the graphics processing unit 304. The graphics processing unit 304 displays an image on a screen of the monitor 311 in accordance with an instruction from the processor 301.

A keyboard 312 and a mouse 313 are connected to the input interface 305. The input interface 305 transmits to the processor 301 a signal transmitted from the keyboard 312 or the mouse 313. The mouse 313 is an example of a pointing device and another pointing device, such as a touch panel, a tablet, a touch pad, or a track ball, may be used.

The optical drive unit 306 reads data recorded on an optical disk 314 by the use of a laser beam or the like. The optical disk 314 is a portable record medium on which recorded data can be read by the reflection of light. The optical disk 314 is a DVD (Digital Versatile Disc), a DVD-RAM, a CD-ROM (Compact Disc Read-Only Memory), a CD-R(Recordable)/RW (ReWritable), or the like.

The unit connection interface 307 is a communication interface used for connecting peripheral units to the computer 300. For example, a memory unit 315 and a memory reader-writer 316 are connected to the unit connection interface 307. The memory unit 315 is a record medium having the function of communicating with the unit connection interface 307. The memory reader-writer 316 is a unit which writes data to or reads out data from a memory card 317.

The network interface 308 is connected to a network 310. The network interface 308 transmits data to or receives data from another computer or a communication unit via the network 310.

By adopting the above hardware configuration, the processing functions of the design apparatus 200 are realized.

The computer 300 realizes the processing functions of the design apparatus 200 by executing a program recorded in, for example, a computer-readable record medium. The program in which the contents of a process that are to be performed by the computer 300 are described is recorded in various record media. For example, the program which is to be executed by the computer 300 is stored in the HDD 303. The processor 301 loads at least a part of the program stored in the HDD 303 into the RAM 302 and executes it. Furthermore, the program which is to be executed by the computer 300 may be recorded on a portable record medium, such as the optical disk 314, the memory unit 315, or the memory card 317. The program recorded on a portable record medium is installed in the HDD 303 and then is executed, under the control of, for example, the processor 301. In addition, the processor 301 may read out the program directly from a portable record medium and execute it.

Furthermore, the technique described above can also be applied to a case where adjacent lower wirings 11 are not set to different potentials.

According to the disclosed technique, a semiconductor device in which enlargement of vias that connect lower and upper wirings is prevented is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device fabrication method comprising:
    forming a first insulating layer;
    forming a first wiring and a second wiring separated from the first wiring in the first insulating layer;
    forming a second insulating layer over the first insulating layer;
    forming in the second insulating layer a via hole that reaches the first wiring;
    forming in the second insulating layer a trench that is connected to the via hole and that includes an outer edge at which a first nick portion is formed beside the via hole and that overlaps with the first wiring and a first part of the second wiring in a plan view; and forming a conductive material in the via hole and the trench to form a via and a third wiring connected to the first wiring.

\* \* \* \* \*